United States Patent
Chen et al.

(10) Patent No.: US 10,811,110 B1
(45) Date of Patent: *Oct. 20, 2020

(54) METHOD OF REDUCING INJECTION TYPE OF PROGRAM DISTURB DURING PROGRAM PRE-CHARGE IN MEMORY DEVICE

(71) Applicant: SanDisk Technologies LLC, Addison, TX (US)

(72) Inventors: Hong-Yan Chen, San Jose, CA (US); Wei Zhao, Fremont, CA (US); Henry Chin, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/903,294

(22) Filed: Jun. 16, 2020

Related U.S. Application Data

(63) Continuation of application No. 16/418,642, filed on May 21, 2019, now Pat. No. 10,770,157.

(51) Int. Cl.
| | |
|---|---|
| *G11C 16/34* | (2006.01) |
| *G11C 16/24* | (2006.01) |
| *G11C 16/04* | (2006.01) |
| *G11C 16/08* | (2006.01) |
| *G11C 16/10* | (2006.01) |

(52) U.S. Cl.
CPC ...... *G11C 16/3427* (2013.01); *G11C 16/0483* (2013.01); *G11C 16/08* (2013.01); *G11C 16/10* (2013.01); *G11C 16/24* (2013.01)

(58) Field of Classification Search
CPC . G11C 16/3427; G11C 16/0483; G11C 16/08; G11C 16/10; G11C 16/24
USPC .................................................. 365/185.02
See application file for complete search history.

(56) References Cited

U.S. PATENT DOCUMENTS

| | | | |
|---|---|---|---|
| 7,433,241 | B2 | 10/2008 | Dong et al. |
| 8,441,853 | B2 | 5/2013 | Li |
| 8,988,937 | B2 | 3/2015 | Dunga et al. |
| 9,460,805 | B1 | 10/2016 | Pang et al. |
| 10,283,202 | B1 | 5/2019 | Chen et al. |
| 10,559,367 | B2 * | 2/2020 | Yip ................... G11C 16/0483 |
| 2017/0178738 | A1 | 6/2017 | Yip |
| 2019/0279729 | A1 | 9/2019 | Chen et al. |
| 2019/0355408 | A1 | 11/2019 | Shin et al. |

(Continued)

OTHER PUBLICATIONS

U.S. Appl. No. 16/418,642, filed May 21, 2019.

(Continued)

*Primary Examiner* — Fernando Hidalgo
(74) *Attorney, Agent, or Firm* — Vierra Magen Marcus LLP

(57) ABSTRACT

Techniques are described for reducing an injection type of program disturb in a memory device during the pre-charge phase of a program loop. In one approach, a pre-charge voltage on the selected word line and drain side word lines is adjusted based on a risk of the injection type of program disturb. Risk factors such as temperature, WLn position, Vpgm and the selected sub-block, can be used to set the pre-charge voltage to be lower when the risk is higher. In another approach, the pre-charge voltage on the source side word lines is adjusted to reduce a channel gradient and/or the amount of time in which the injection type of program disturb occurs.

20 Claims, 21 Drawing Sheets

(56) References Cited

U.S. PATENT DOCUMENTS

2020/0168276 A1     5/2020  Yang
2020/0219569 A1*    7/2020  Lee .................... G11C 16/3459

OTHER PUBLICATIONS

U.S. Appl. No. 16/418,642, filed May 21, 2019, Non-final Office Action dated Apr. 7, 2020.
Response to Office Action dated May 22, 2020, U.S. Appl. No. 16/418,642, filed May 21, 2019.
Notice of Allowance dated Jun. 5, 2020, U.S. Appl. No. 16/418,642, filed May 21, 2019.

* cited by examiner

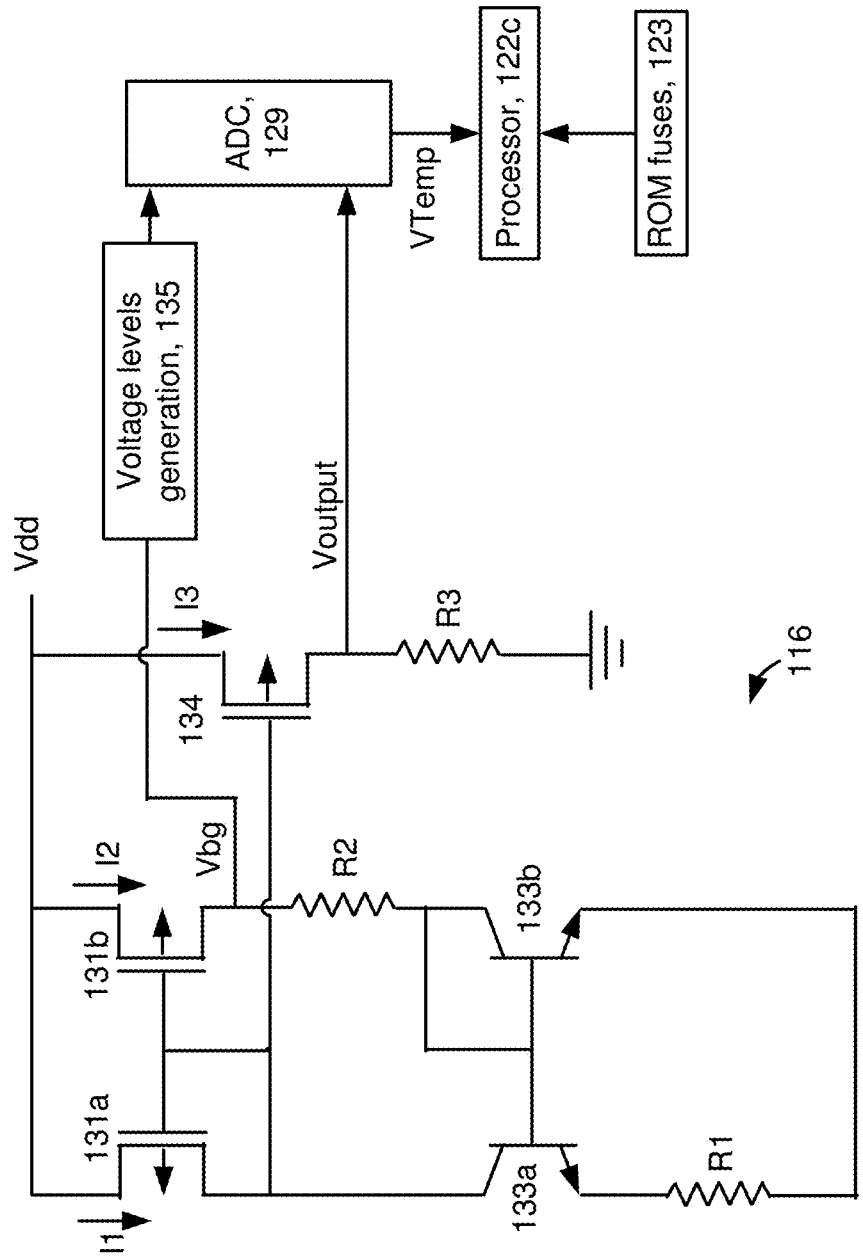

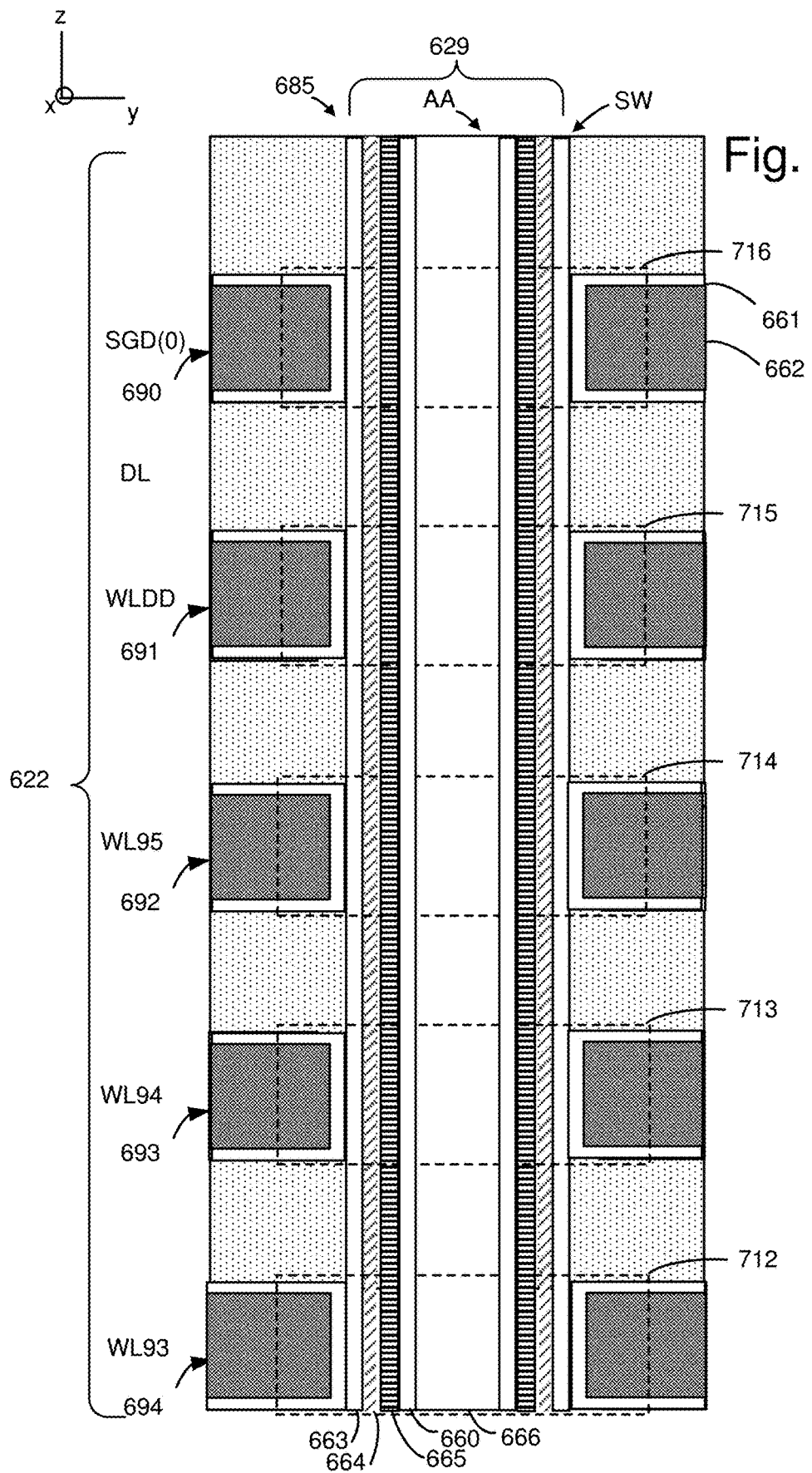

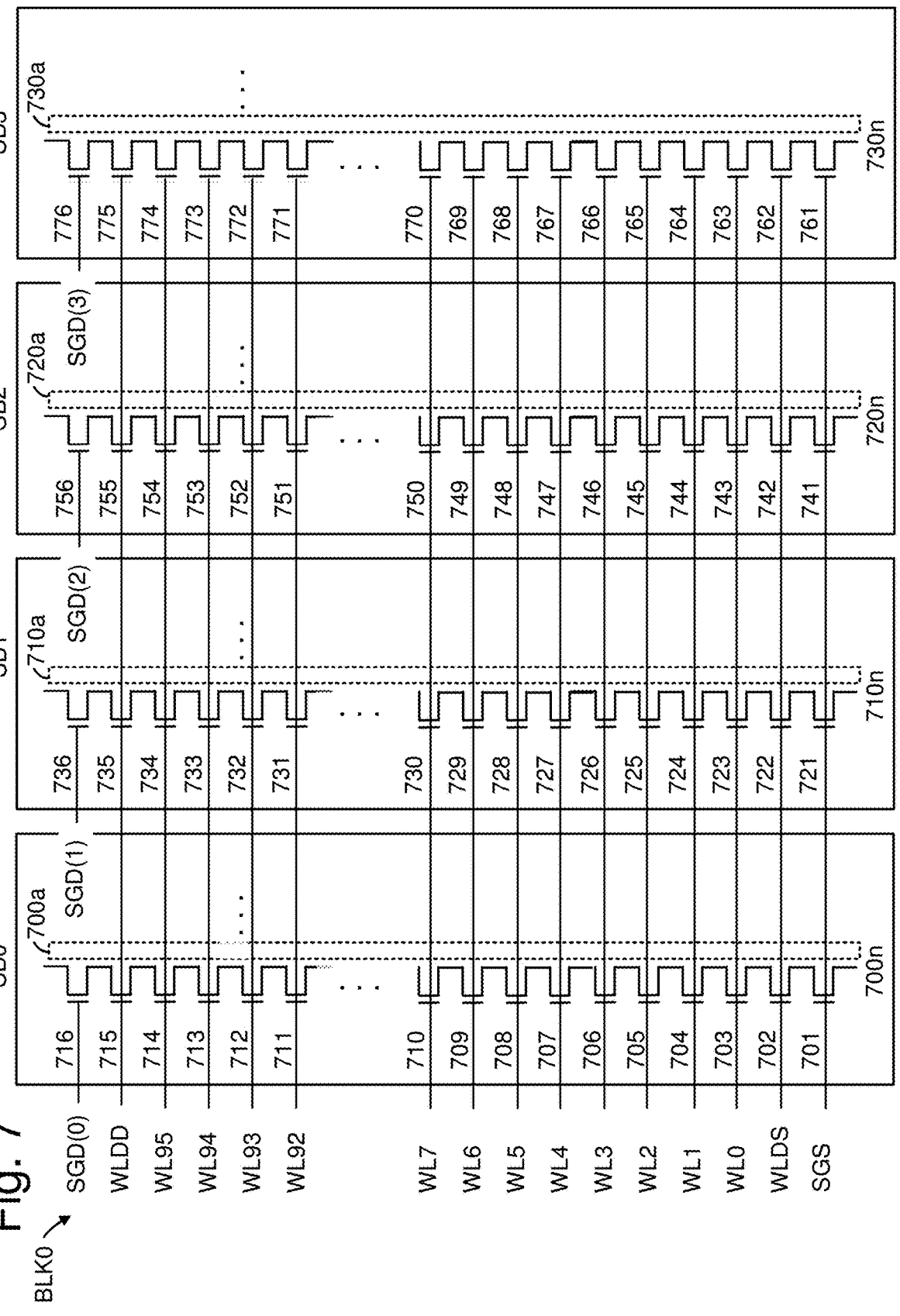

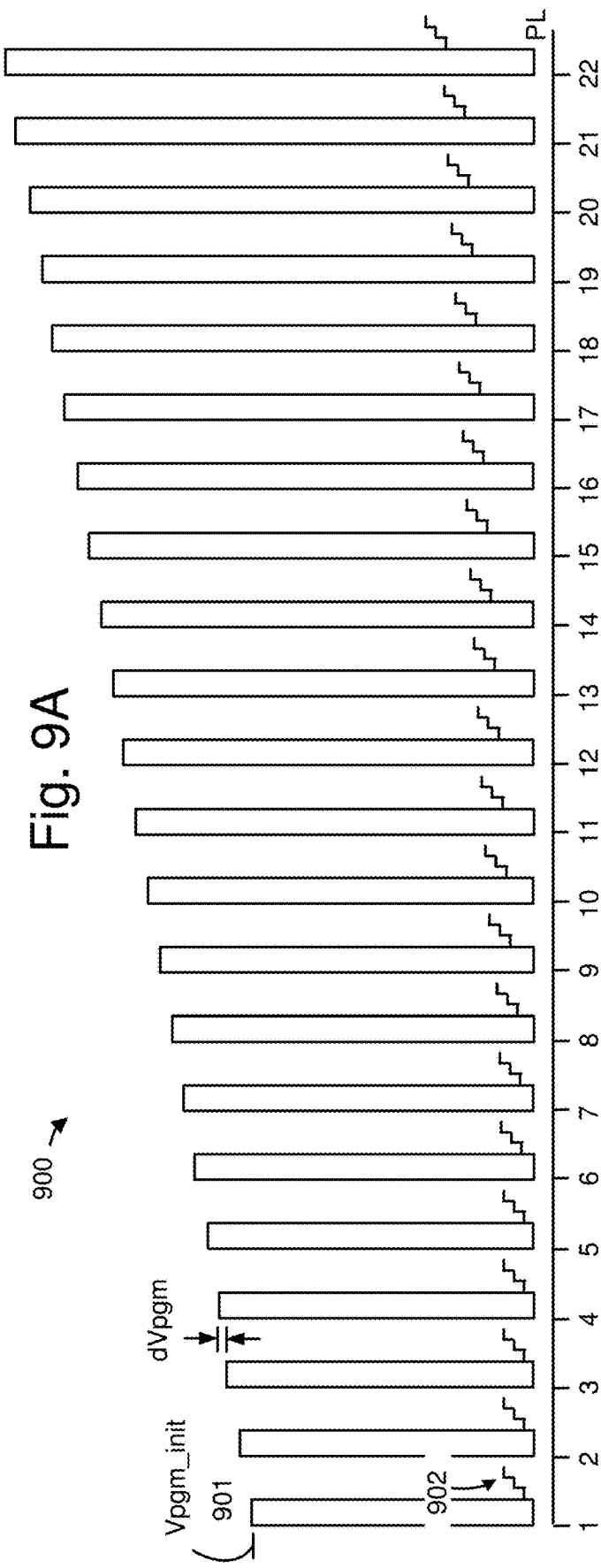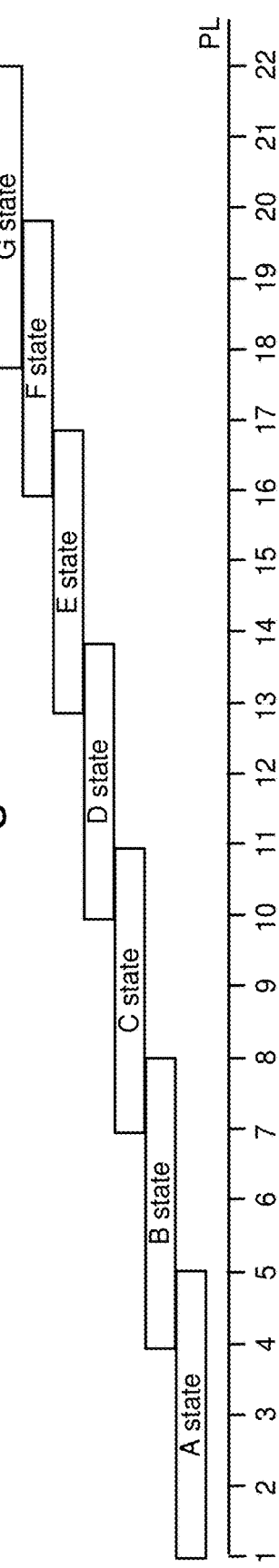

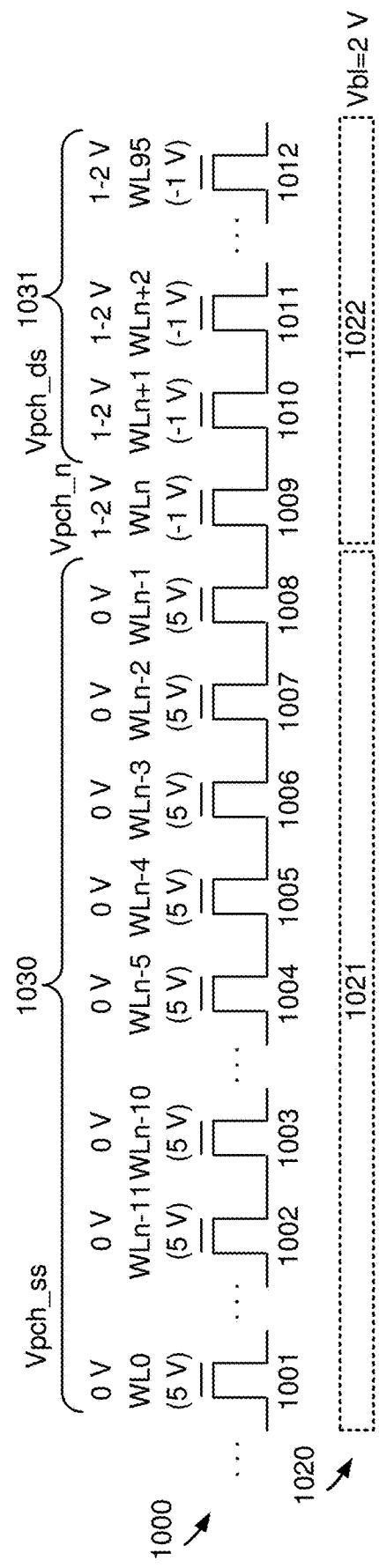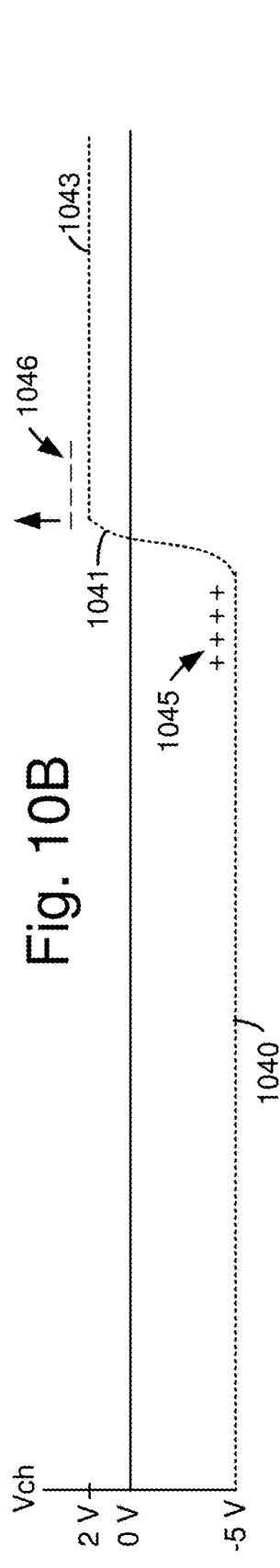

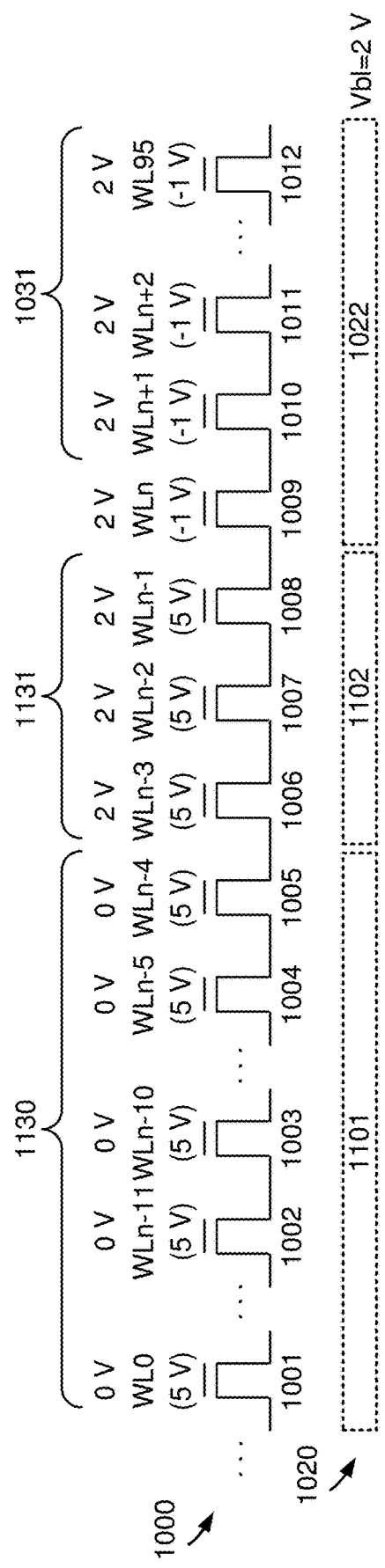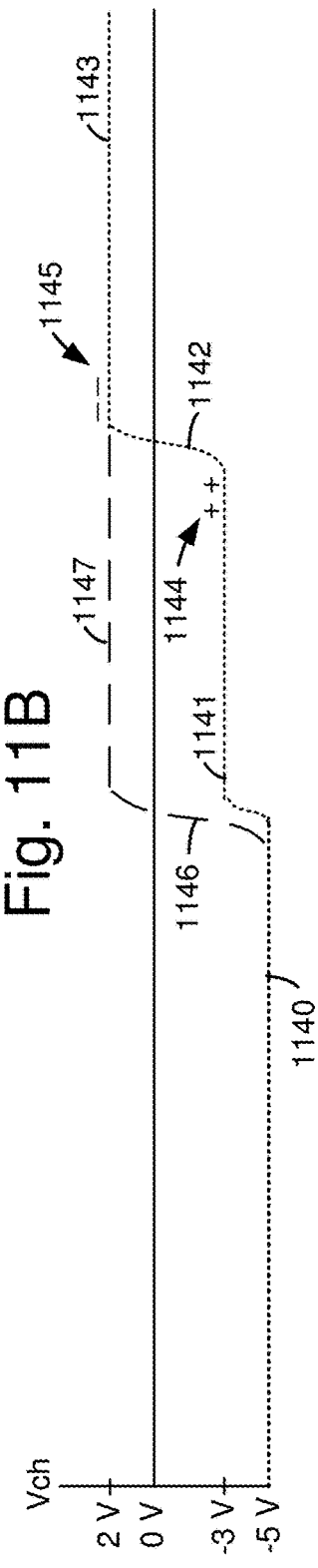

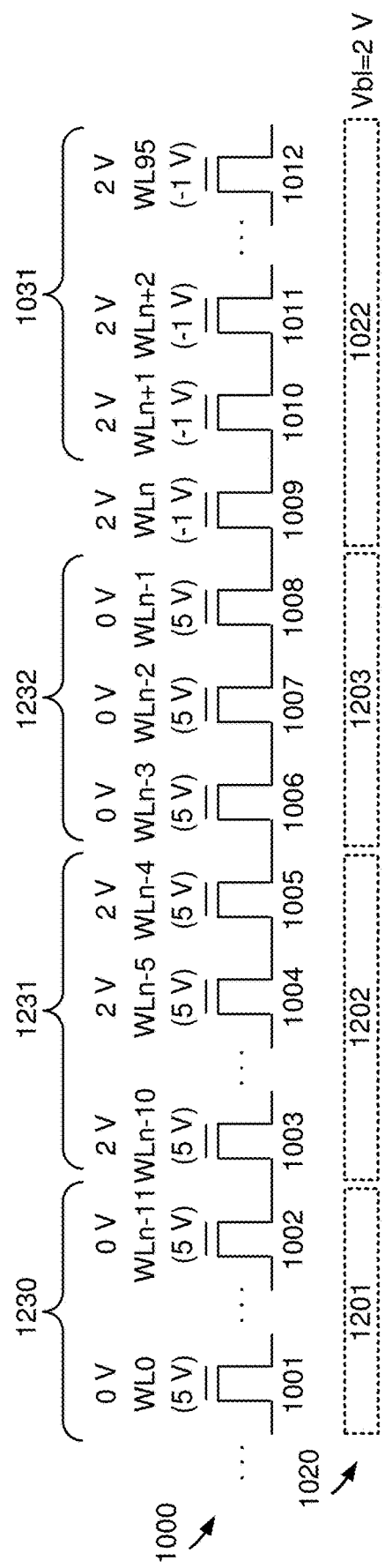
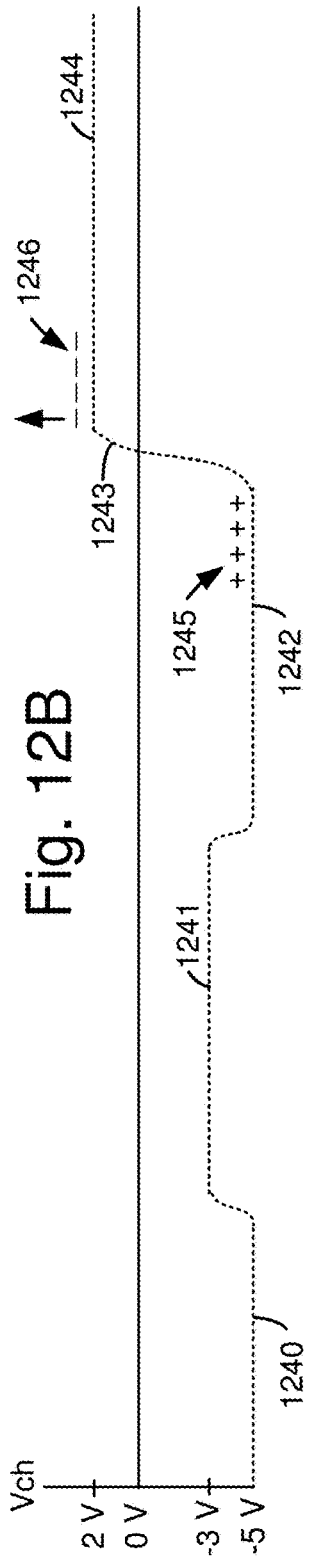
Fig. 12A
Fig. 12B

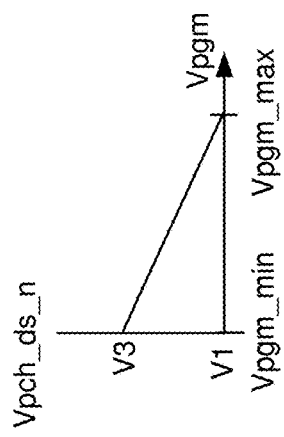
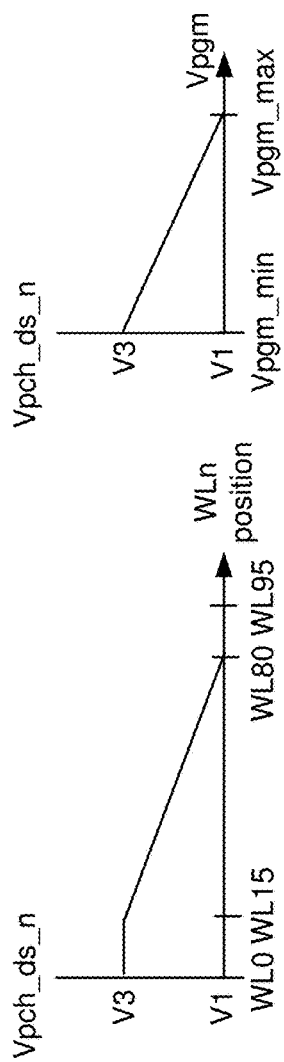
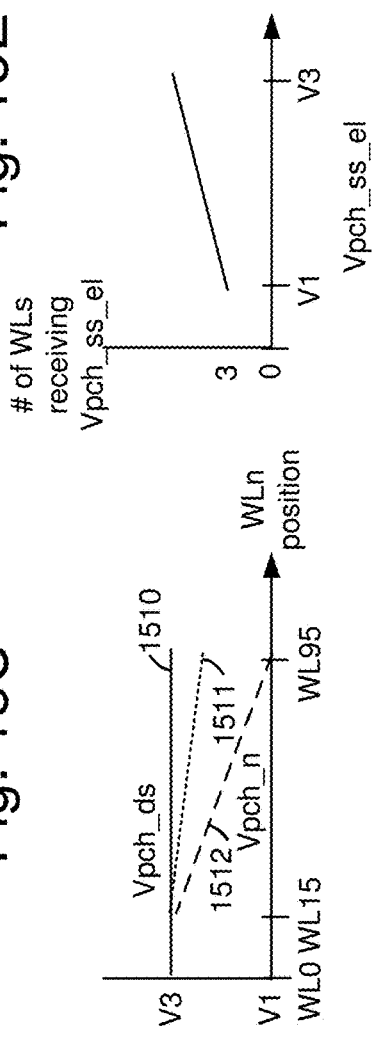
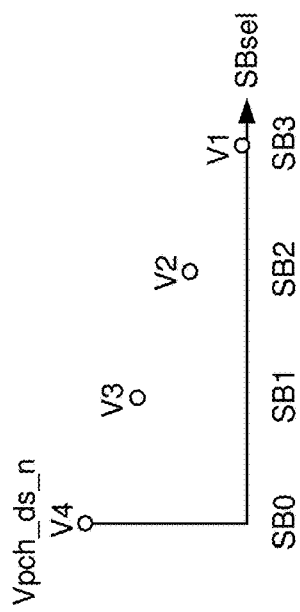
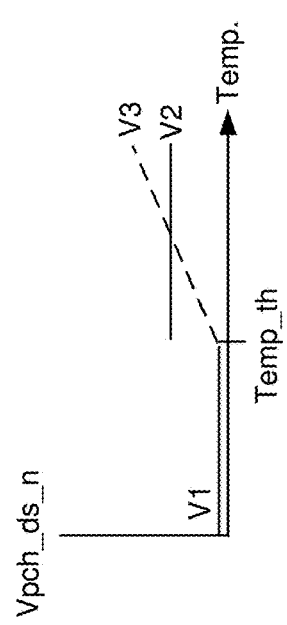

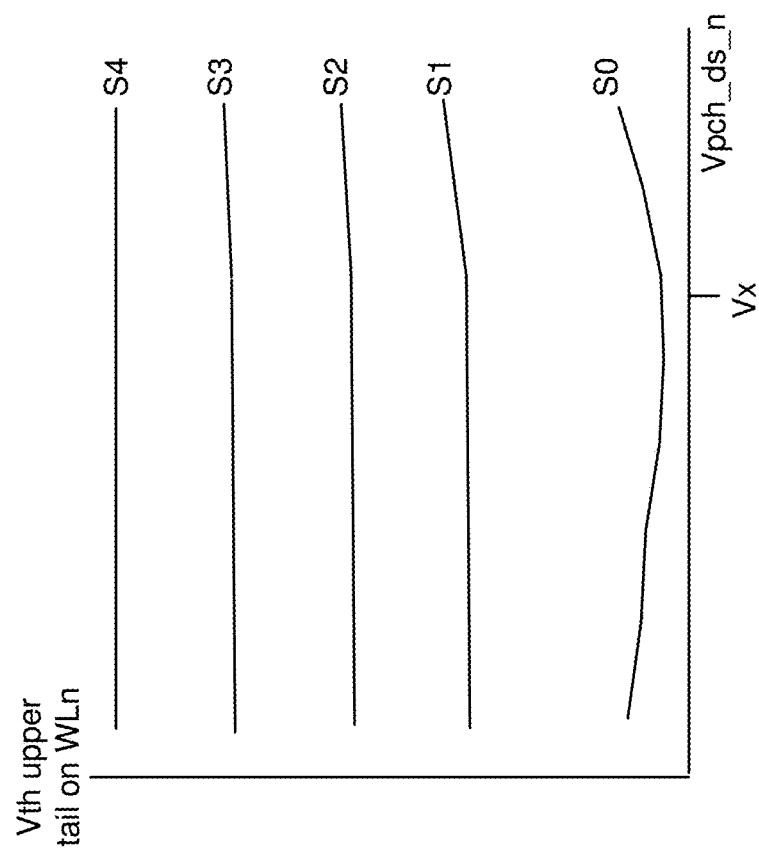

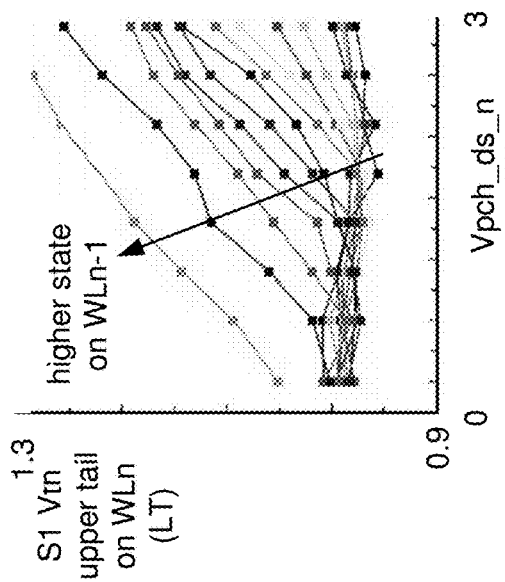
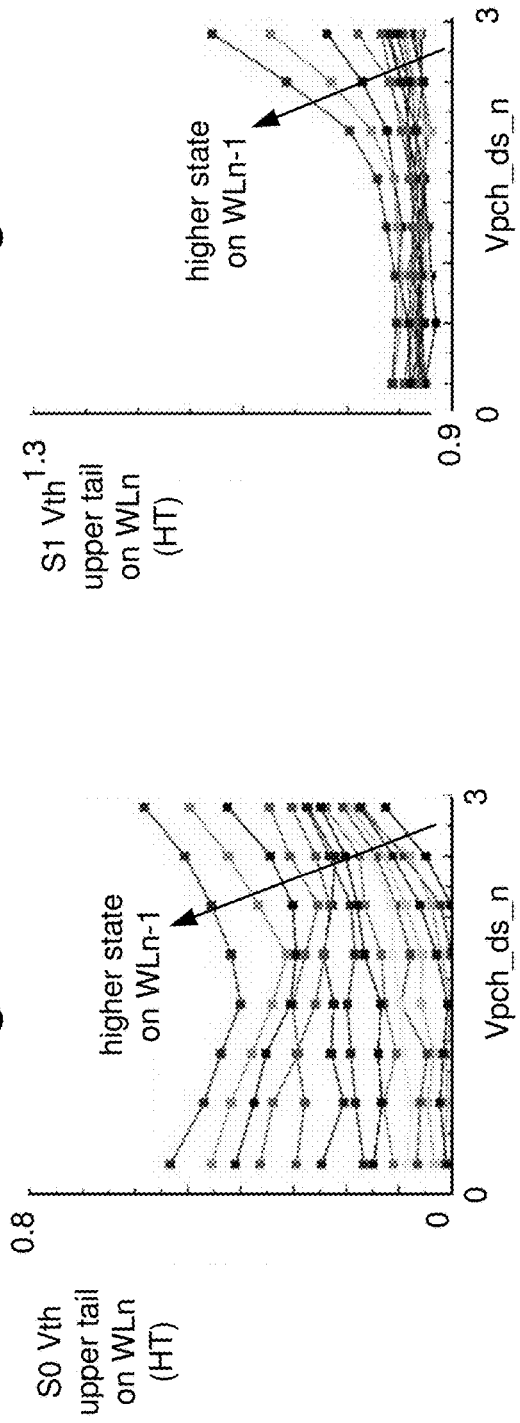
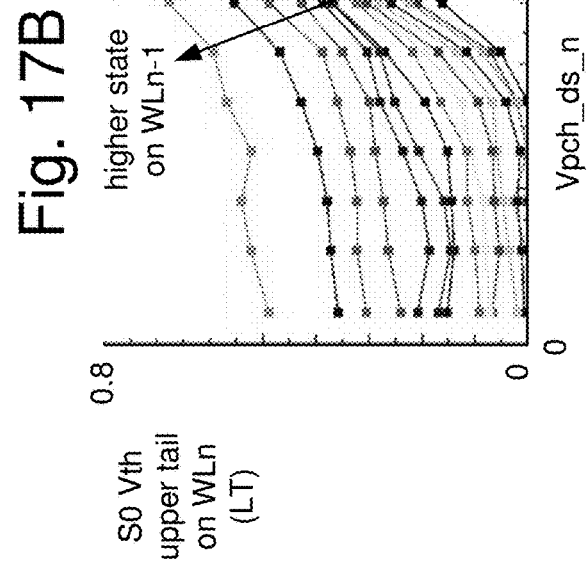
Fig. 17A, Fig. 17B, Fig. 17C, Fig. 17D

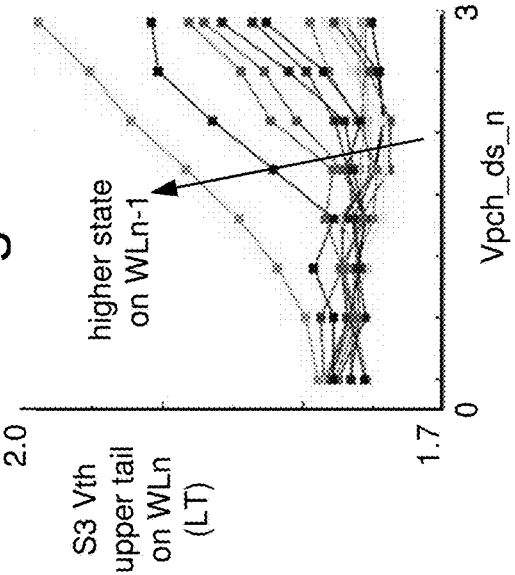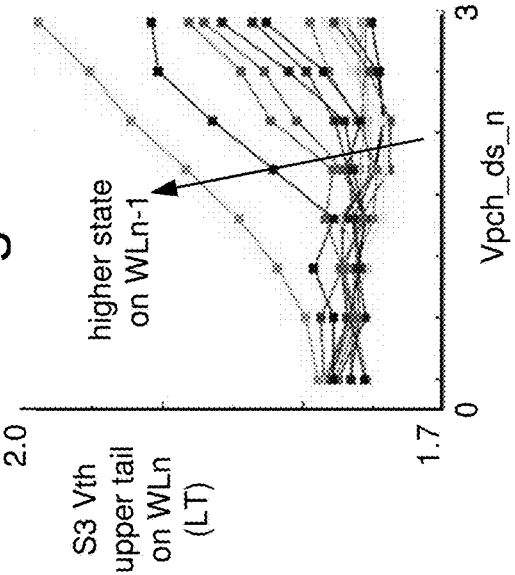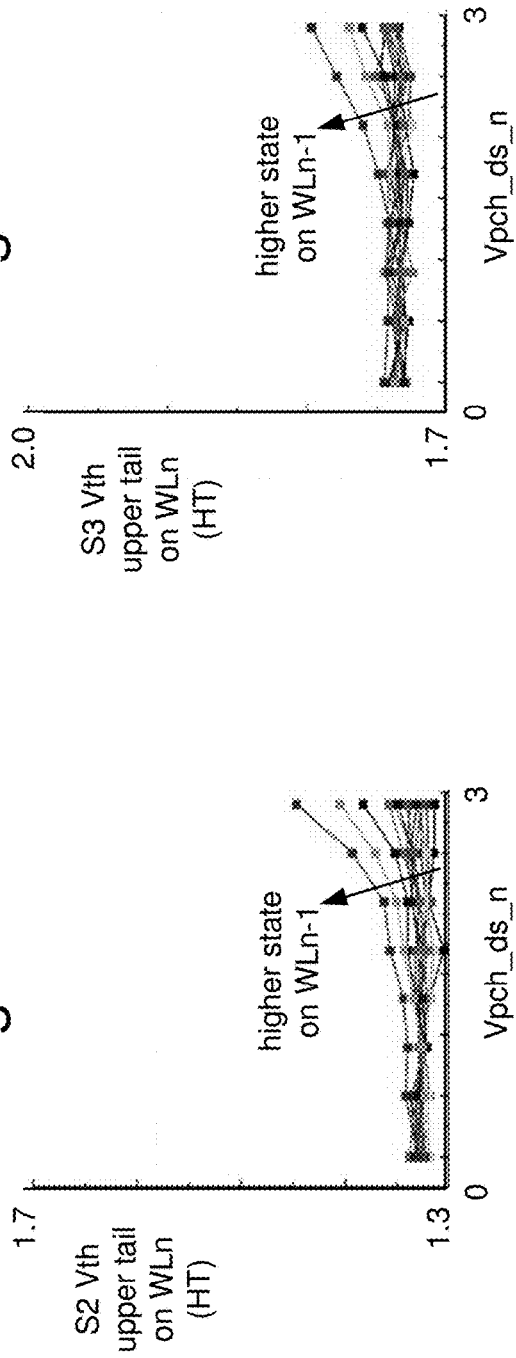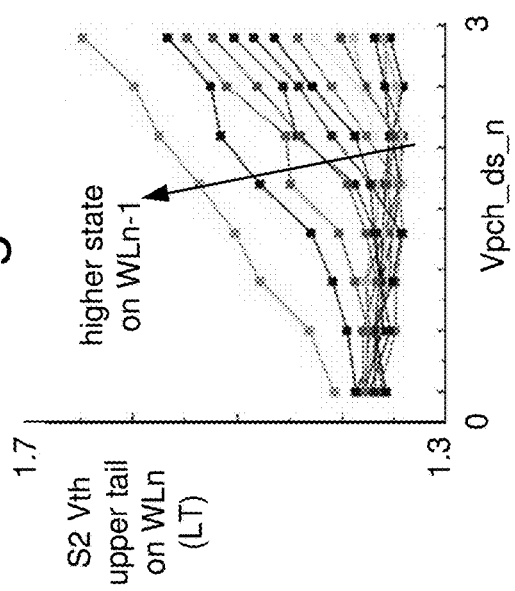

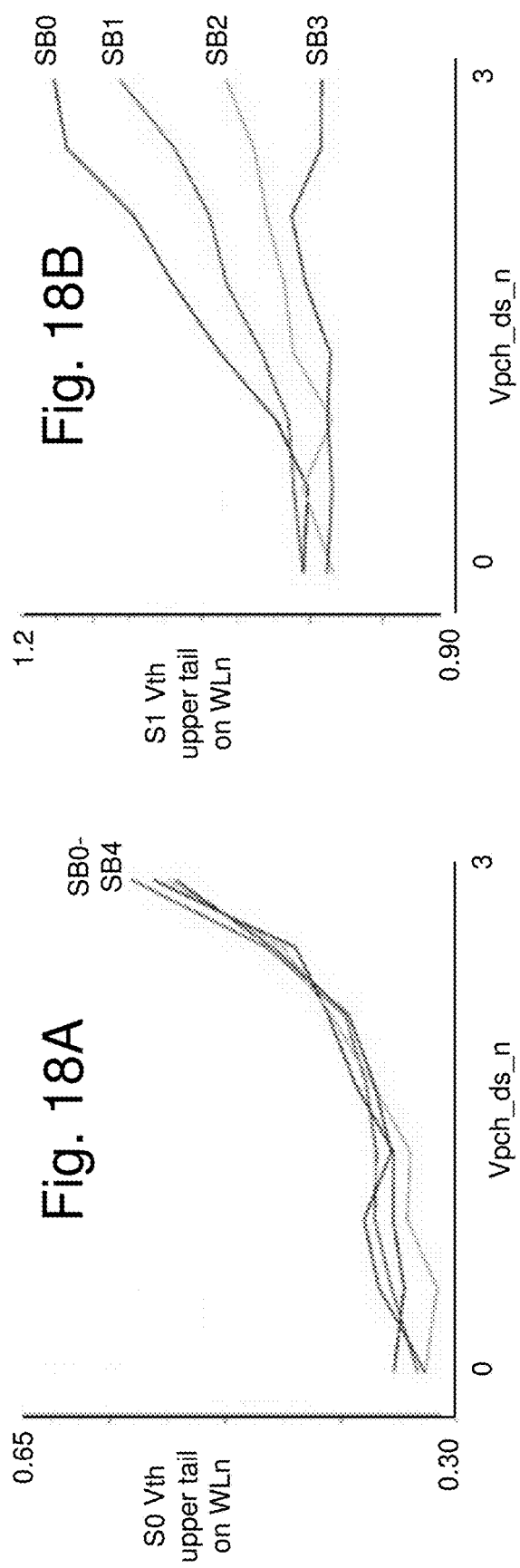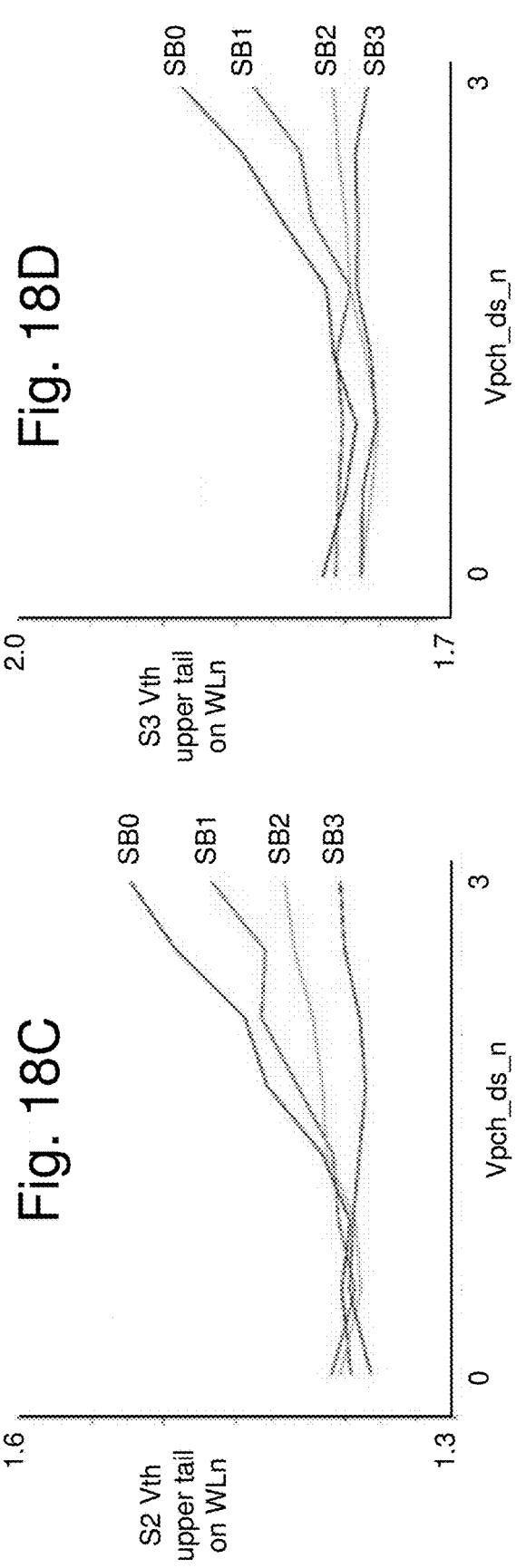

US 10,811,110 B1

METHOD OF REDUCING INJECTION TYPE OF PROGRAM DISTURB DURING PROGRAM PRE-CHARGE IN MEMORY DEVICE

CLAIM OF PRIORITY

This application is a continuation application of U.S. patent application Ser. No. 16/418,642, entitled "Method Of Reducing Injection Type Of Program Disturb During Program Pre-Charge In Memory Device," by Chen et al., filed May 21, 2019 and incorporated by reference herein in its entirety.

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 1B depicts an example of the temperature-sensing circuit 116 of FIG. 1A.

FIG. 6B depicts a close-up view of the region 622 of the stack of FIG. 6A.

FIG. 7 depicts an example view of NAND strings in a block BLK0 which is consistent with FIGS. 4 and 6A.

FIG. 9A depicts an example voltage signal used in a program operation, consistent with FIG. 8A.

FIG. 9B depicts an example of verify voltages used in different program loops of FIG. 9A.

FIG. 10A depicts a NAND string and corresponding channel regions in an example pre-charge configuration.

FIG. 10B depicts channel voltages consistent with FIG. 10A.

FIG. 11A depicts a NAND string and corresponding channel regions in another example pre-charge configuration.

FIG. 11B depicts channel voltages consistent with FIG. 11A.

FIG. 12A depicts a NAND string and corresponding channel regions in another example pre-charge configuration.

FIG. 12B depicts channel voltages consistent with FIG. 12A.

FIG. 15A depicts an example plot of Vpch_ds_n versus temperature (Temp.)

FIG. 15B depicts an example plot of Vpch_ds_n versus a selected sub-block, SBsel.

FIG. 15C depicts an example plot of Vpch_ds and Vpch_n versus the position of WLn.

FIG. 15D depicts an example plot of Vpch_ds_n versus the position of WLn.

FIG. 15E depicts an example plot of a number of word lines receiving Vpch_ss_el versus Vpch_ss_el, consistent with FIGS. 12A and 12B.

FIG. 15F depicts an example plot of Vpch_ds_n versus Vpgm.

FIG. 16 depicts a plot of an upper tail of a Vth of memory cells of WLn versus Vpch_ds_n for different data states S0-S4 of FIG. 8B.

FIG. 17A depicts a plot of an upper tail of a Vth of S0-state memory cells of WLn versus Vpch_ds_n for different data states on WLn−1, at a high temperature.

FIG. 17B depicts a plot of an upper tail of a Vth of S0-state memory cells of WLn versus Vpch_ds_n for different data states on WLn−1, at a low temperature.

FIG. 17C depicts a plot of an upper tail of a Vth of S1-state memory cells of WLn versus Vpch_ds_n for different data states on WLn−1, at a high temperature.

FIG. 17D depicts a plot of an upper tail of a Vth of S1-state memory cells of WLn versus Vpch_ds_n for different data states on WLn−1, at a low temperature.

FIG. 17E depicts a plot of an upper tail of a Vth of S2-state memory cells of WLn versus Vpch_ds_n for different data states on WLn−1, at a high temperature.

FIG. 17F depicts a plot of an upper tail of a Vth of S2-state memory cells of WLn versus Vpch_ds_n for different data states on WLn−1, at a low temperature.

FIG. 17G depicts a plot of an upper tail of a Vth of S3-state memory cells of WLn versus Vpch_ds_n for different data states on WLn–1, at a high temperature.

FIG. 17H depicts a plot of an upper tail of a Vth of S3-state memory cells of WLn versus Vpch_ds_n for different data states on WLn–1, at a low temperature.

FIG. 18A depicts a plot of an upper tail of a Vth of S0-state memory cells of WLn versus Vpch_ds_n for different sub-blocks SB0-SB3.

FIG. 18B depicts a plot of an upper tail of a Vth of S1-state memory cells of WLn versus Vpch_ds_n for different sub-blocks SB0-SB3.

FIG. 18C depicts a plot of an upper tail of a Vth of S2-state memory cells of WLn versus Vpch_ds_n for different sub-blocks SB0-SB3.

FIG. 18D depicts a plot of an upper tail of a Vth of S3-state memory cells of WLn versus Vpch_ds_n for different sub-blocks SB0-SB3.

DETAILED DESCRIPTION

Apparatuses and techniques are described for reducing an injection type of program disturb in a memory device during the pre-charge phase of a program loop.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order. For example, the programming may start at the word line at the source-side of the block and proceed to the word line at the drain-side of the block, one word line at a time. A word line can also be programmed in a sub-block programming order, extending from SB0 to SB3, for example, when there are four sub-block (FIG. 7). For example, a portion of the memory cells of WLn in SB0 are first programmed, followed by a portion of the memory cells of WLn in SB1, a portion of the memory cells of WLn in SB2 and then a portion of the memory cells of WLn in SB3. A programming operation may include one or more sets of increasing program voltages or pulses which are applied to a word line in respective program loops or program-verify iterations, such as depicted in FIGS. 9A and 9B. Verify tests may be performed after each program voltage to determine whether the memory cells have completed programming. When programming is completed for a memory cell, it can be locked out from further programming while programming continues for other memory cells in subsequent program loops.

Figure 14:
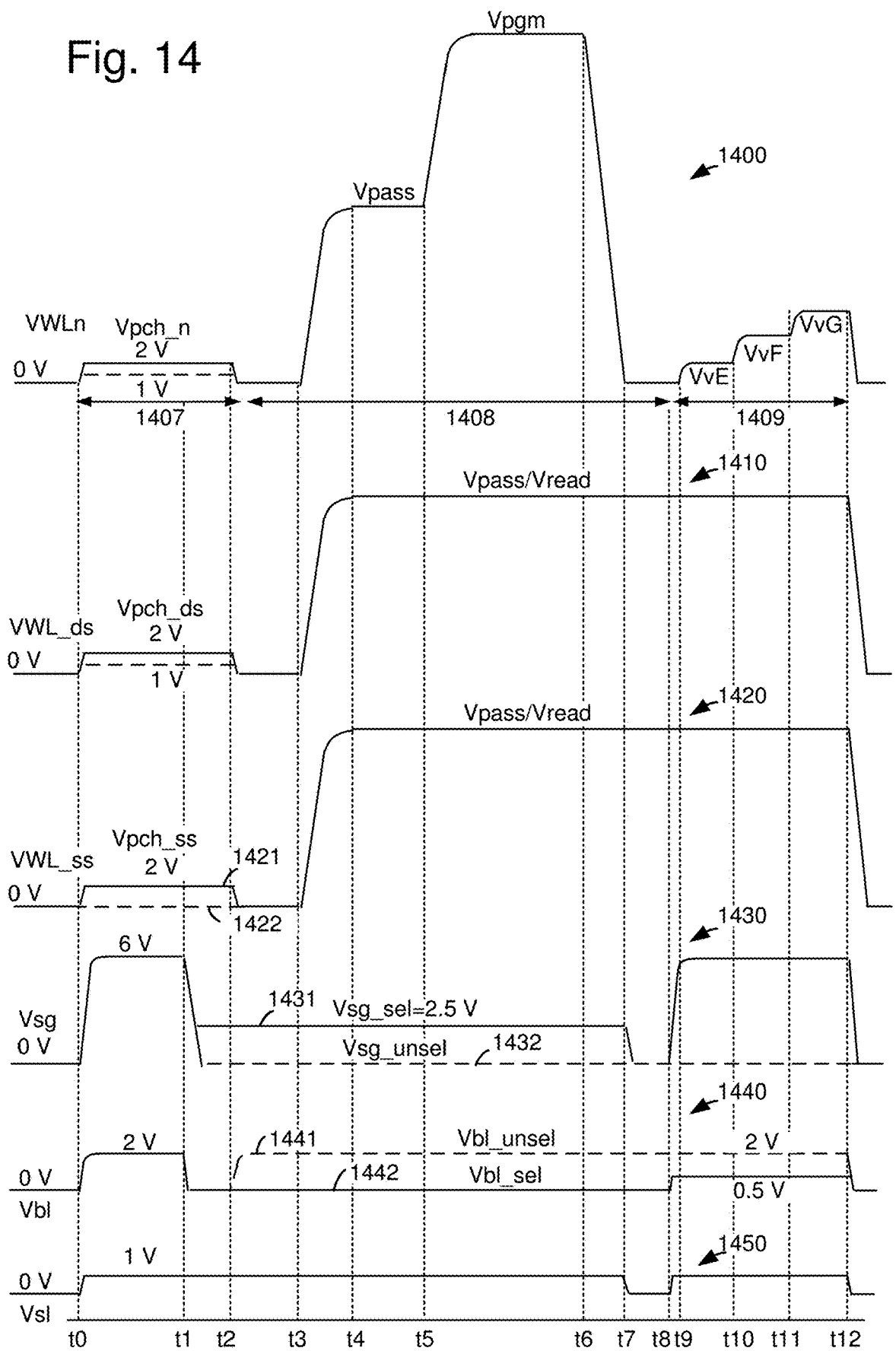
FIG. 14 depicts example voltage signals for performing the process of FIG. 13A.

A program loop can include a pre-charge phase 1407, a program phase 1408 and a verify phase 1409, as depicted in FIG. 14.

Each memory cell may be associated with a data state according to write data in a program command. Based on its data state, a memory cell will either remain in the erased (Er) state or be programmed to a programmed data state. For example, in a one bit per cell memory device, there are two data states including the erased state and the programmed state. In a two-bit per cell memory device, there are four data states including the erased state and three programmed data states referred to as the A, B and C data states. In a three-bit per cell memory device, there are eight data states including the erased state and seven programmed data states referred to as the A, B, C, D, E, F and G data states (see FIG. 8A). In a four-bit per cell memory device, there are sixteen data states including the erased state S0 and fifteen programmed data states S1-S15 (see FIG. 8B). Each data state can be represented by a range of threshold voltages (Vth) in the memory cells.

After the memory cells are programmed, the data can be read back in a read operation. A read operation can involve applying a series of read voltages to a word line while sensing circuitry determines whether cells connected to the word line are in a conductive (turned on) or non-conductive (turned off) state. If a cell is in a non-conductive state, the Vth of the memory cell exceeds the read voltage. The read voltages are set at levels which are expected to be between the threshold voltage levels of adjacent data states. Moreover, during the read operation, the voltages of the unselected word lines are ramped up to a read pass level or turn on level which is high enough to place the unselected memory cells in a strongly conductive state, to avoid interfering with the sensing of the selected memory cells. A word line which is being programmed or read is referred to as a selected word line, WLn.

However, program disturb can occur in the pre-charge phase of a program loop. In particular, when voltages are applied to the bit line and to the selected and unselected word lines, a source-side injection (SSI) type of program disturb, also referred to as a hot carrier injection type of program disturb, can occur in inhibited NAND strings for memory cells connected to WLn. During the pre-charge phase, the memory cells on the drain side of WLn are in the erased state, so that they can be easily turned on by a low word line voltage such as 0-2 V and allow a bit line voltage such as 2 V to pass in a corresponding channel region 1022 (FIG. 10A). The memory cells connected to WLn are also in the erased state at the start of a program operation. Also, the memory cells assigned to the erased state will remain in the erased state throughout the program operation.

However, the memory cells on the source side of WLn have been programmed to different states so that they are mostly turned off and block the bit line voltage. Instead, the voltage of the corresponding channel region 1021 is set based on a difference between the word line voltage and the Vth. With a Vth of 5 V, for instance, and 0 V on the word line, the corresponding channel region 1021 can be −5 V. This results in a channel gradient of 7 V adjacent to WLn (plot 1041). The channel gradient can generate electron-hole pairs, where the electrons 1046 are injected into the WLn memory cells, causing the SSI type of program disturb.

Techniques provided herein address the above and other issues by reducing SSI program disturb and improving write performance. In one approach, the pre-charge voltage on WLn (Vpch_n) and on the drain side word lines (Vpch_ds) is adjusted based on a risk of the injection type of program disturb. Risk factors such as temperature, WLn position, Vpgm and the selected sub-block position in a sub-block programming order, can be used to set the pre-charge voltage to be lower when the risk is higher. This reduces the electric field which draws in the electrons into the charge trapping layer of the WLn memory cells, so that the amount of disturb is reduced. The risk of disturb is greater when the temperature is lower, the WLn position is further from the source side of the NAND strings, Vpgm is higher and when there is a relatively large number of sub-blocks which are programmed before the selected sub-block. See FIGS. 10A, 10B, 15A-15D and 15F.

In another approach, the pre-charge voltage on the source side word lines (Vpch_ss) is adjusted to reduce the channel gradient and/or the amount of time in which the injection type of program disturb occurs. One approach, depicted in FIGS. 11A and 11B, uses an elevated voltage, Vpch_ss_el (e.g., 2 V) for a subset of the source side word lines which are adjacent to WLn, compared to the Vpch_ss (e.g., 0 V) of the remaining source side word lines. This reduces the channel gradient (e.g., 5 V in FIG. 11B compared to 7 V in FIG. 10B).

Another approach, depicted in FIGS. 12A and 12B, uses Vpch_ss_el for a subset of the source side word lines which are not adjacent to WLn. This reduces the amount of time in which the channel gradient exists. In particular, the holes generated by the channel gradient are contained in a channel region 1203 which is between WLn and the word lines with Vpch_ss_el. The holes can more quickly increase the voltage of the channel region 1203 since it is smaller than the channel region 1021. When the voltage of the channel region 1203 increases, the channel gradient and the risk of program disturb decrease.

The techniques can be used separately or combined.

These and other features are discussed further below.

Figure 1A:
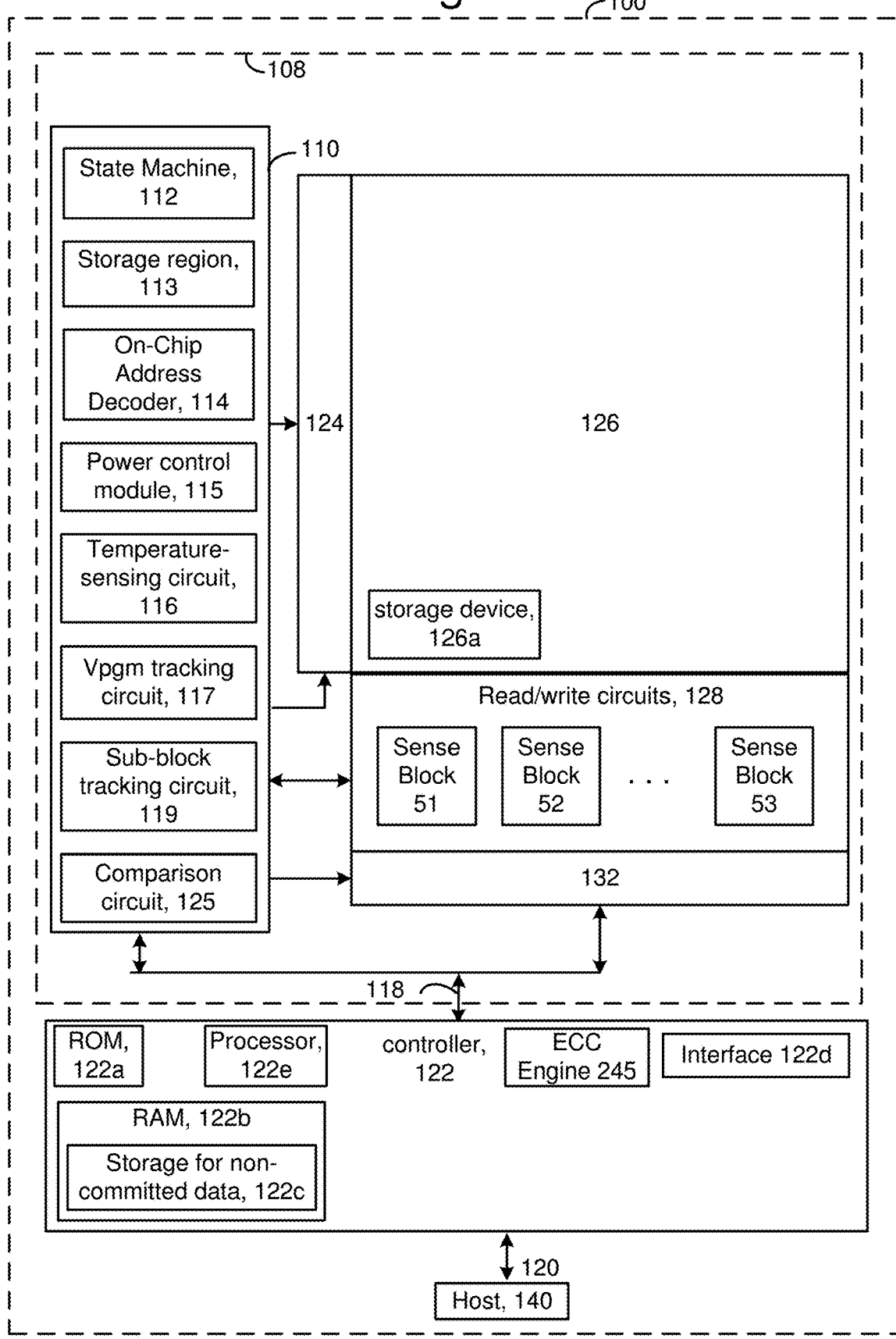
FIG. 1A is a block diagram of an example memory device.

FIG. 1A is a block diagram of an example memory device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit), a temperature-sensing circuit 116, a Vpgm tracking circuit 117, a sub-block tracking circuit 119 and a comparison circuit 125. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach. The temperature-sensing circuit 116 can detect a temperature of the memory device at the time of a program operation, for example, for use by the comparison circuit. The Vpgm tracking circuit 117 can track the magnitude of Vpgm or detect when Vpgm reaches a threshold. The program loop could also be tracked, since it corresponds to Vpgm. The sub-block tracking circuit 119 can track the currently selected sub-block being programmed.

Figure 13C:
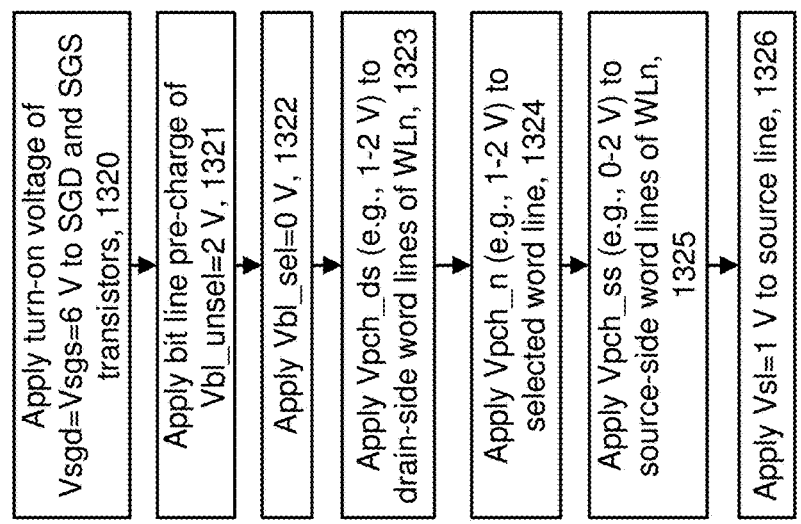
FIG. 13C depicts a flowchart of another example process for performing the pre-charge phase of step 1301 of FIG. 13A.
Figure 13B:
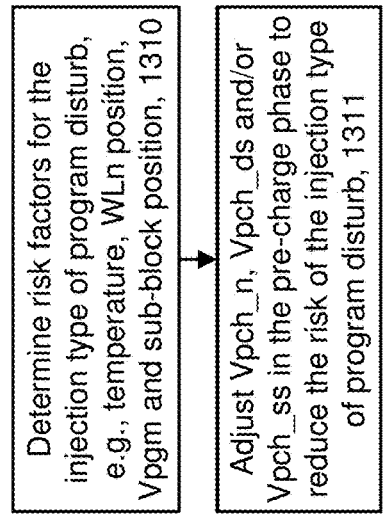
FIG. 13B depicts a flowchart of an example process for performing the pre-charge phase of step 1301 of FIG. 13A.

The comparison circuit 125 can store threshold values of temperature, program voltage, sub-block number and word line position, and compare these threshold values to the current temperature, program voltage, sub-block number and word line position, respectively, to determine a risk of SSI type of program disturb and a corresponding countermeasure, consistent with FIG. 13B. The comparison circuit can receive the temperature from the circuit 116, the program voltage from the circuit 117, the sub-block number from the circuit 119 and the word line position from the state machine 112 and make a decision as to the strength of a program disturb countermeasure, or whether to use a program disturb countermeasure, for instance. The temperature, program voltage, sub-block number and word line position are examples of risk factors for the injection type of program disturb.

See FIG. 1B for an example implementation of the temperature-sensing circuit. The temperature-sensing circuit, Vpgm tracking circuit, sub-block tracking circuit, and comparison circuit may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, temperature-sensing circuit 116, program loop and Vpgm tracking circuit 117, P-E cycle tracking circuit 119, comparison circuit 125, sense blocks 51, 52, . . . , 53, read/write circuits 128, controller 122, and so forth.

The off-chip controller 122 (which in one embodiment is an electrical circuit) may comprise a processor 122e, storage devices (memory) such as ROM 122a and RAM 122b and an error-correction code (ECC) engine 245. The ECC engine can correct a number of read errors. The RAM 122b can be a DRAM which includes a storage location 122c for non-committed data. During programming, a copy of the data to be programmed is stored in the storage location 122c until the programming is successfully completed. In response to the successful completion, the data is erased from the storage location and is committed or released to the block of memory cells. The storage location 122c may store one or more word lines of data.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122e fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read-only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

FIG. 1B depicts an example of the temperature-sensing circuit 116 of FIG. 1A. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor 122e. This is data indicating a temperature of the memory device. ROM fuses 123 store data which correlates the matching voltage level to a temperature, in one approach. The processor then uses the temperature to set temperature-based parameters in the memory device such as by using the comparison circuit.

Vbg, is obtained by adding the base-emitter voltage (Vbe) across the transistor 131b and the voltage drop across the resistor R2. The bipolar transistor 133a has a larger area (by a factor N) than the transistor 133b. The PMOS transistors 131a and 131b are equal in size and are arranged in a current mirror configuration so that the currents I1 and I2 are substantially equal. We have Vbg=Vbe+R2×I2 and I1=Ve/R1 so that I2=Ve/R1. As a result, Vbg=Vbe+R2×kT ln(N)/R1×q, where T is temperature, k is Boltzmann's constant and q is a unit of electric charge. The source of the transistor 134 is connected to a supply voltage Vdd and the node between the transistor's drain and the resistor R3 is the output voltage, Voutput. The gate of the transistor 134 is connected to the same terminal as the gates of transistors 131a and 131b and the current through the transistor 134 mirrors the current through the transistors 131a and 131b.

Figure 2:
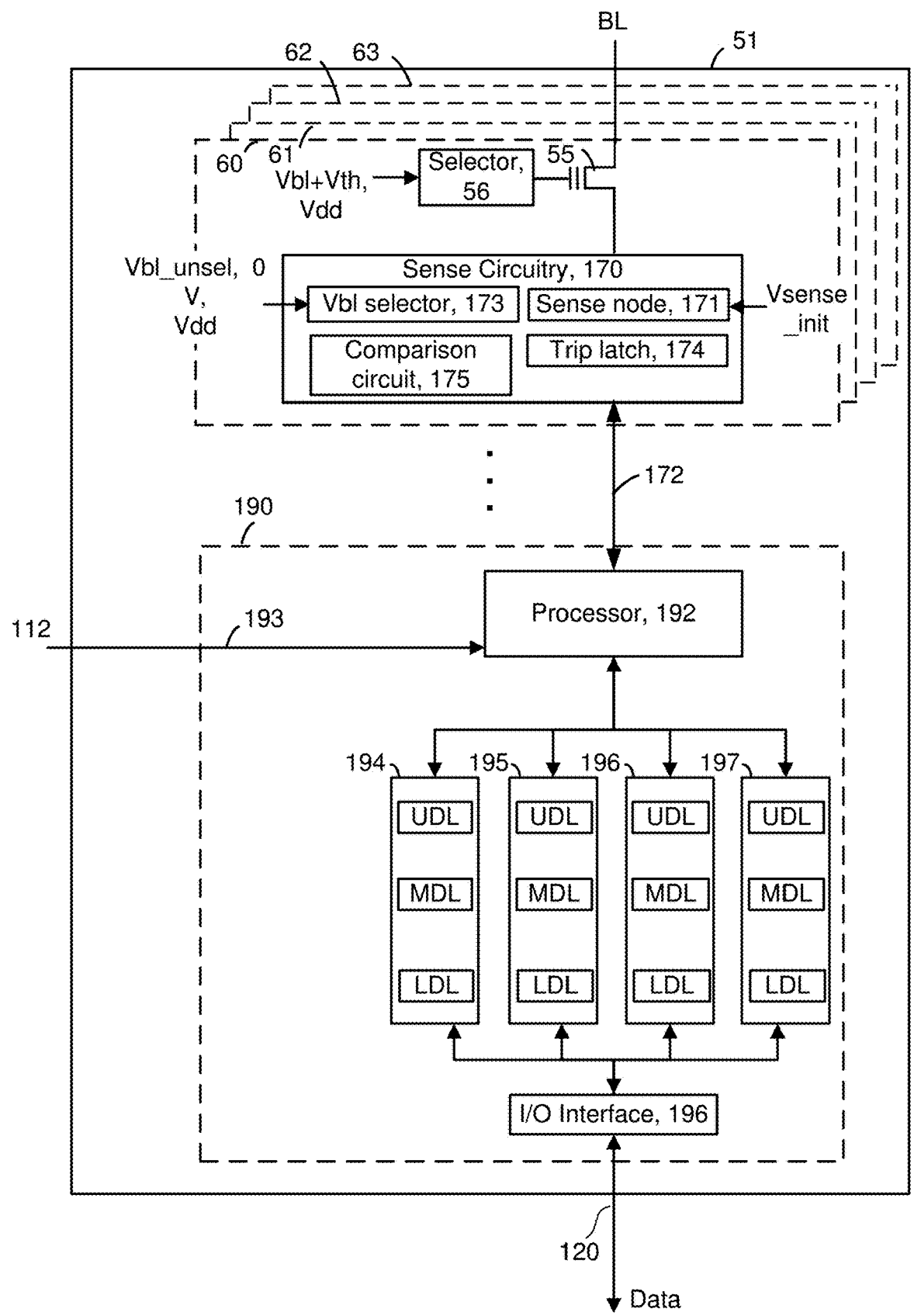
FIG. 2 is a block diagram depicting one embodiment of the sense block 51 of FIG. 1A.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor 55 minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of three data latches, e.g., comprising individual latches LDL, MDL and UDL, can be provided for each sense circuit. In some cases, a different number of data latches may be used. In a three bit per cell embodiment, LDL stores a bit for a lower page of data, MDL stores a bit for a middle page of data and UDL stores a bit for an upper page of data.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through the various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming. Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
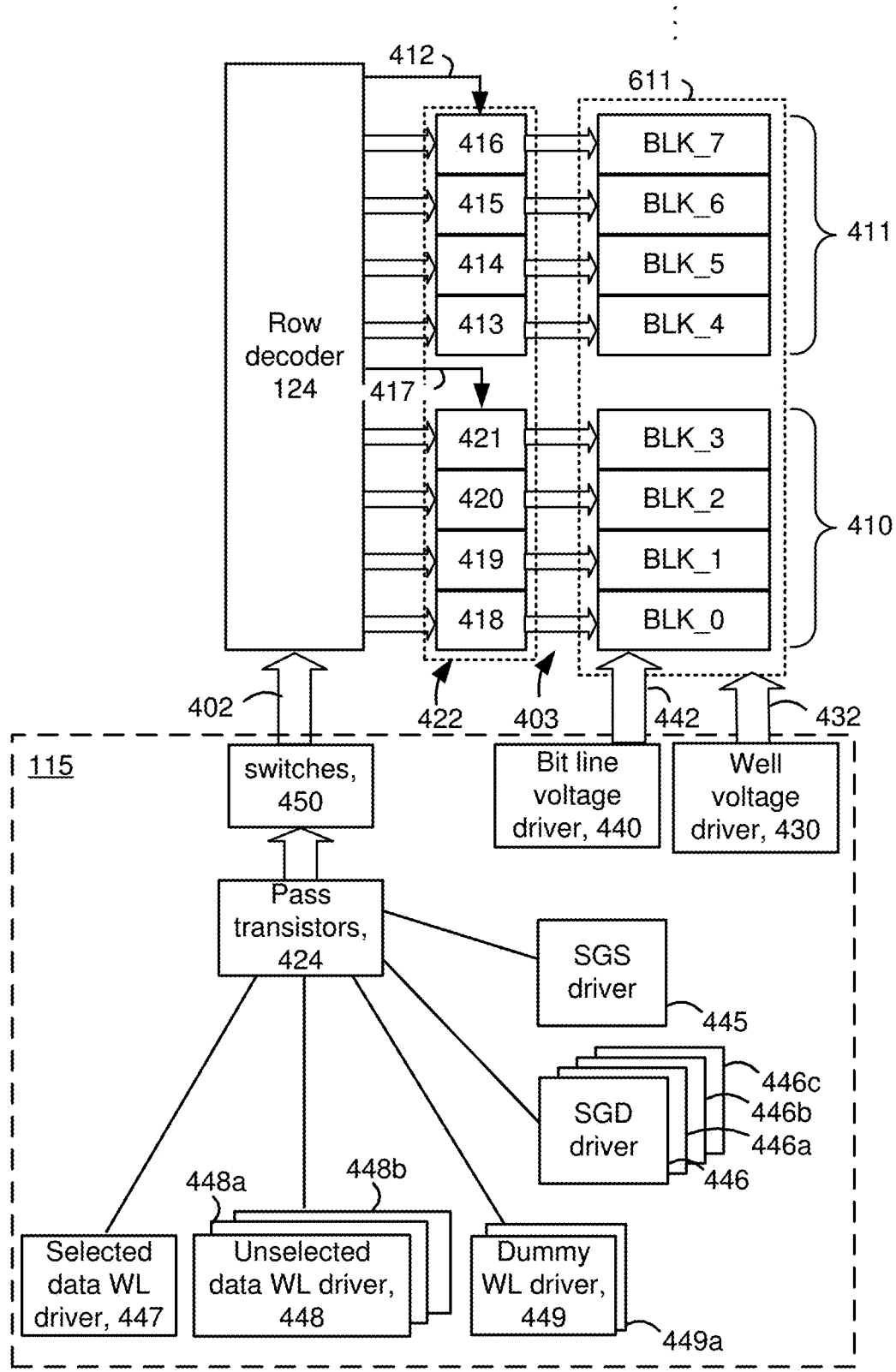
FIG. 3 depicts an example implementation of the power control module 115 of FIG. 1A for providing voltages to blocks of memory cells.

FIG. 3 depicts an example implementation of the power control module 115 of FIG. 1A for providing voltages to blocks of memory cells. In this example, the memory structure 126 includes a set 410 of four related blocks, BLK_0 to BLK_3, and another set 411 of four related blocks, BLK_4 to BLK_7. The blocks can be in one or more planes. The row decoder 124 of FIG. 1A provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK_4, BLK_5, BLK_6 and BLK_7, respectively. A control gate line 417 is connected to sets of pass transistors 418, 419, 420 and 421, which in turn are connected to control gate lines of BLK_0, BLK_1, BLK_2 and BLK_3, respectively.

Typically, program or read operations are performed on one selected block at a time and on one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during a program or read operation. The driver 447 can provide a pre-charge voltage Vpch_n on WLn. Drivers 448, 448a and 448b can be used for unselected data word lines, and dummy word line drivers 449 and 449a can be used to provide voltages on dummy word lines WLDD and WLDS, respectively, in FIG. 6A. For example, the driver 448 can be used to apply voltages, including the pre-charge voltage Vpch_ds, to the drain-side unselected word lines and the driver 448a and 448b can be used to apply voltages, including the pre-charge voltage Vpch_ss, to the source-side unselected word lines.

The voltage drivers can also include separate SGD drivers for each sub-block. For example, SGD drivers 446, 446a, 446b and 446c can be provided for SB0, SB1, SB2 and SB3, respectively, such as in FIG. 7. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
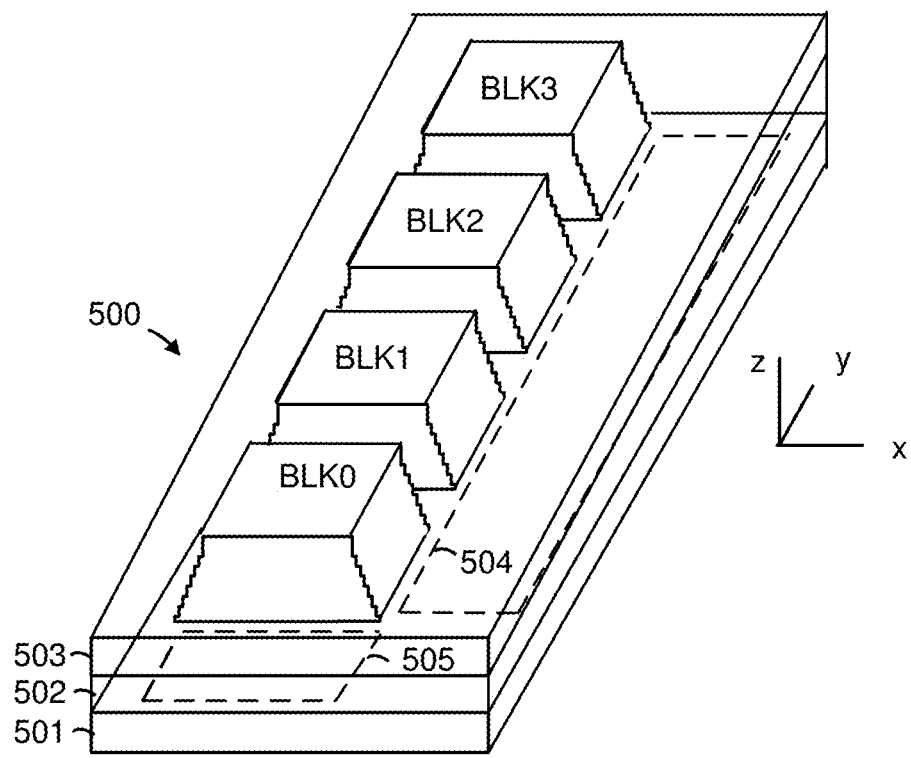
FIG. 4 is a perspective view of a memory device 500 comprising a set of blocks in an example 3D configuration of the memory structure 126 of FIG. 1A.

FIG. 4 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
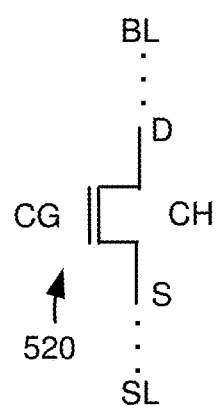
FIG. 5 depicts an example transistor 520.
Figure 6A:
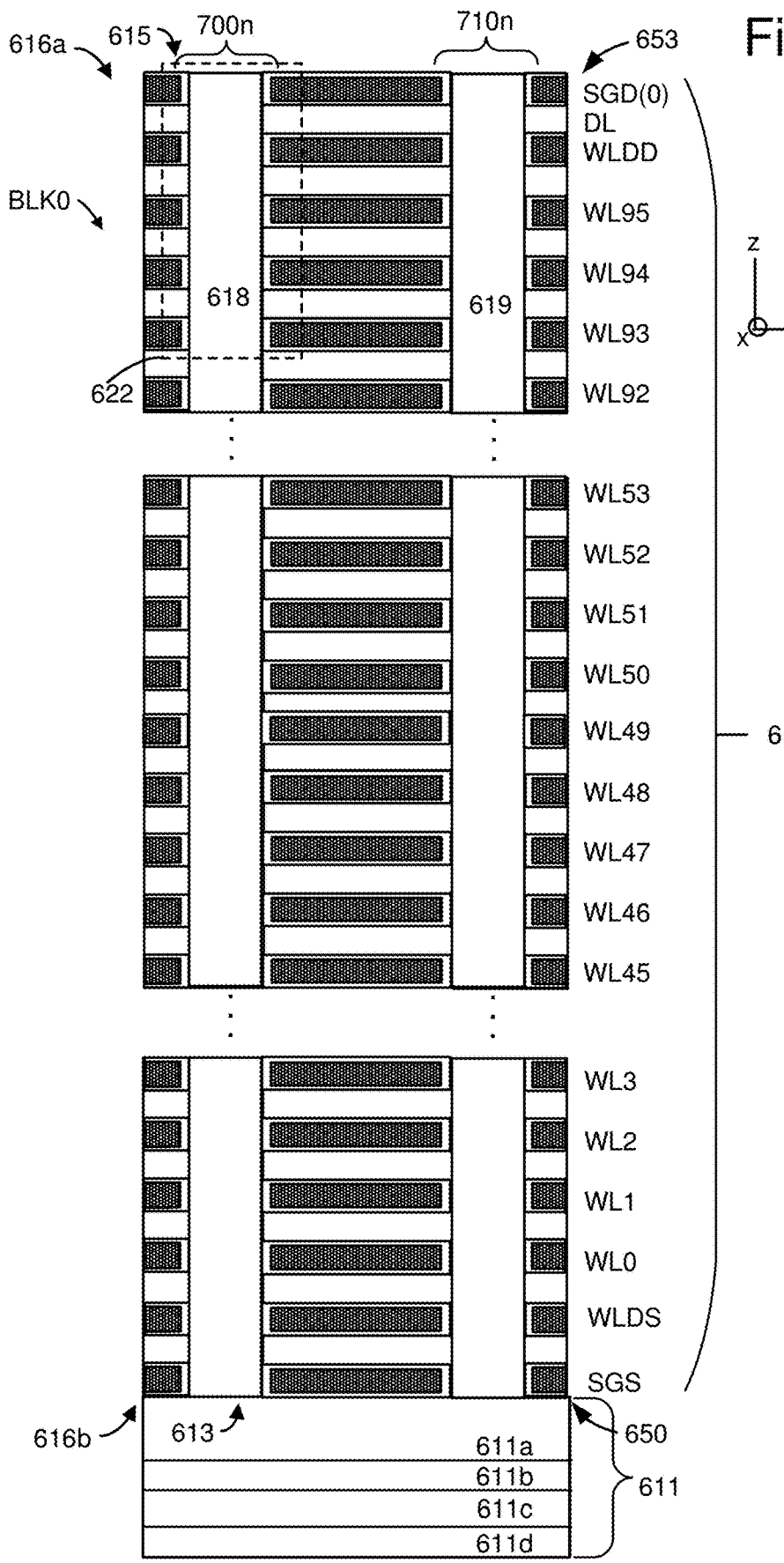
FIG. 6A depicts an example cross-sectional view of a portion of BLK0 of FIG. 4, including NAND strings 700n and 710n.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient.

WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611a (see also FIG. 3) is an n-type source diffusion layer or well in the substrate. The well region is in contact with a source end of each string of memory cells in a block. The n-type well region 611a in turn is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach, and form a source line SL which provides a voltage to a source end of each NAND string in a block.

The NAND string 700n has a source end 613 at a bottom 616b of the stack 610 and a drain end 615 at a top 616a of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each NAND string or set of connected transistors comprises a channel which extends continuously from one or more source-end select gate transistors to one or more drain-end select gate transistors. For example, the channels 700a, 710a, 720a and 730a extend continuously in the NAND strings 700n, 710n, 720n and 730n, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Note that the techniques described herein for using a state machine to implement different modes are compatible with various types of memory device including the 3D memory device of FIG. 4-7 and a 2D memory device.

FIG. 7 depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. For example, this can involve programming WL0 in SB0, SB1, SB2 and then SB2, then programming WL1 in SB0, SB1, SB2 and then SB2, and so forth. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730*n* includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

Figure 8A:
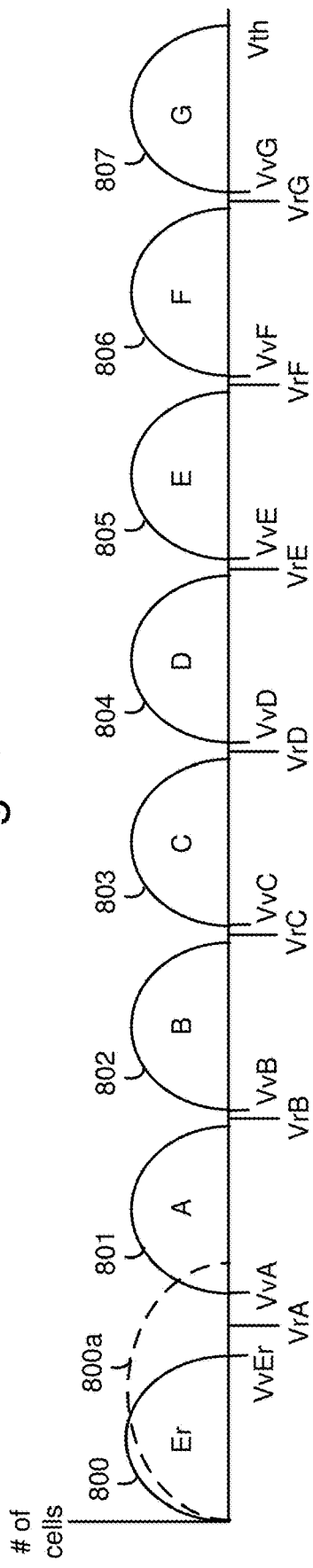
FIG. 8A depicts example Vth distributions of a set of memory cells with three bits per cell and eight data states.

FIG. 8A depicts example Vth distributions of a set of memory cells with three bits per cell and eight data states. The vertical axis depicts a number of memory cells on a logarithmic scale, and the horizontal axis depicts a Vth of the memory cells on a linear scale. In one approach, at a start of a program operation, the memory cells are all initially in the erased (Er) state, as represented by the Vth distribution 800. After the program operation is successfully completed, the memory cells assigned to the A-G states are represented by the Vth distributions 801-807. The memory cells assigned to the lower states including the erased state may experience SSI program disturb so that they are represented by the Vth distribution 800*a*, for example for the Er state, with an upshifted upper tail.

The memory cells which are programmed to the A-G states using verify voltages of VvA-VvG, respectively, are represented by the Vth distributions 801-807, respectively. These Vth distributions are obtained just after completion of the program operation, and assume no program disturb or neighbor word line interference has occurred. The verify voltages are used in the program-verify tests of the memory cells. Read voltages VrA-VrG can be used for reading the states of the memory cells in a read operation. The verify voltages and read voltages are examples of program parameters for three-bit per cell operations.

In an erase operation, the data memory cells transition from the Vth distributions of the programmed data states, e.g., states A-G, to the erased state. The erase operation includes an erase phase in which the memory cells are biased for erasing followed by an erase-verify test. The erase-verify test can use an erase-verify voltage, VvEr, which is applied to the word lines.

The Er-G states are examples of assigned data states, and the A-G states are examples of programmed data states, in this eight state example. The number of data states could be higher or low than eight data states.

Figure 8B:
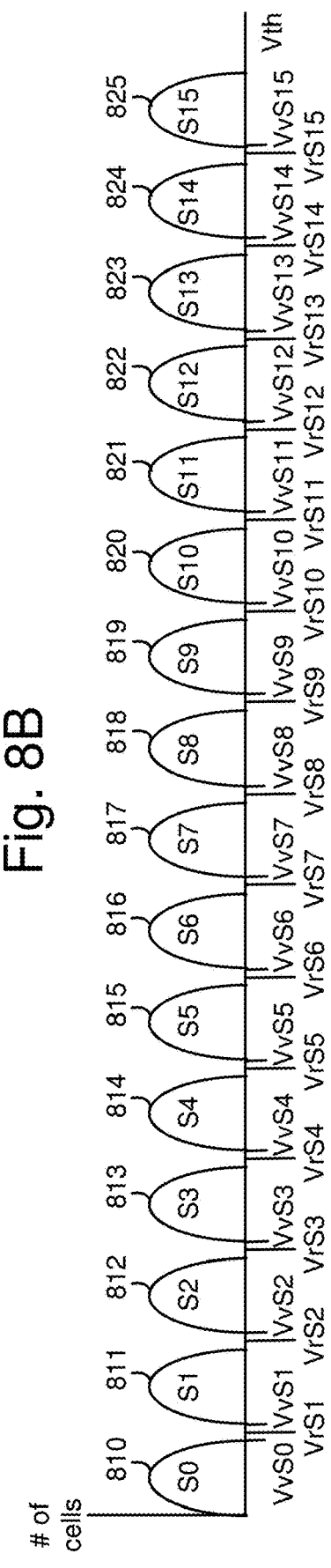
FIG. 8B depicts example Vth distributions of a set of memory cells with four bits per cell and sixteen data states.

FIG. 8B depicts example Vth distributions of a set of memory cells with four bits per cell and sixteen data states. The Vth distribution 810 is for the erased state S0 and the Vth distributions 811-825 are for the programmed data states S1-S15, respectively, which have corresponding verify voltages VvS1-VvS15, respectively. The erased state has an erase-verify voltage VvS0. Read voltages VrS1-VrS15 are also depicted.

The memory cells may experience program disturb, which is not depicted for simplicity.

FIG. 9A depicts an example voltage signal used in a program operation, consistent with FIG. 8A. The voltage signal 900 includes a set of program voltages, including an initial program voltage 901, which are applied to a word line selected for programming. The initial program voltage is represented by Vpgm_init and dVpgm denotes the step size. A single program pass is used having 22 program loops, as an example. The verification signals in each program loop, including example verification signals 902, can encompass lower assigned data states, then midrange assigned data states and then higher assigned data states as the program operations proceeds, as depicted in FIG. 9B.

The example verification signals depict three verify voltages as a simplification. As used herein, a verification signal comprises a signal which is applied to a selected word line during a program loop after the application of a program voltage to the selected word line. The verification signal is part of a sensing operation. Memory cells are sensed during the application of the verification signal to judge their programming progress. A verification signal includes one or more voltages which are used to judge whether the memory cell has completed programming to an assigned data state. The result of sensing of the Vth relative to a verify voltage can be used to inhibit further programming of a memory cell.

The data which is programmed or read can be arranged in pages. For example, with two bits per cell, two pages of data can be stored in the memory cells connected to a word line. The data of the lower and upper pages can be determined by reading the memory cells using read voltages of VrA and VrC; and VrB, respectively.

With three bits per cell, three pages of data can be stored in the memory cells connected to a word line. The data of the lower, middle and upper pages can be determined by reading the memory cells using read voltages of VrA and VrE; VrB; and VrC and VrG, respectively.

FIG. 9B depicts an example of verify voltages used in different program loops of FIG. 9A. The horizontal bars are time-aligned with the program loop axis of FIG. 9A. The bars overlap in some program loops, indicating that verify operations can be performed for multiple data states in the program loop. With eight data states, the bars indicate that verify voltages for the A, B, C, D, E, F and G states are applied in verification signals in program loops 1-5, 4-8, 7-11, 10-14, 13-17, 16-20 and 18-22, respectively. As mentioned, the verification signals in each program loop can encompass lower assigned data states, then midrange assigned data states and then higher assigned data states as the program operation proceeds.

FIG. 10A depicts a NAND string and corresponding channel regions in an example pre-charge configuration. The NAND string 1000 includes example memory cells 1001-1012 which are connected to word lines WL0, WLn−11, . . . , WLn−10, . . . , WLn−5 to WLn+2, . . . , WL95. The NAND string has a channel 1020 with a source side channel region 1021, on a source side of WLn, and a channel region 1022 adjacent to WLn and on the drain side of WLn. The memory cells 1001-1008 are in the highest data state with Vth=5 V, for example. In practice, the data states will be randomly distributed among the memory cells but this configuration is shown as a worst case, simplified example. The WLn memory cell 1009 is in the erased state at the start of the program operation, and also throughout the program operation if that is the assigned data state of the memory cell, and the memory cells 1010-1012 are in the erased state throughout the program operation since they have not yet been programmed. Vth=−1 V for the erased state memory cells.

The notation above each memory cell represents, from top to bottom, the word line voltage, the word line number and the Vth (in parentheses).

The memory cells are connected to a set of source side word lines 1030, WLn and a set of drain side word lines 1031. The voltage on the source side word lines is 0 V and the voltage on WLn and the drain side word lines can range between 1-2 V, for instance, depending on the risk of program disturb. A positive bit line voltage Vbl=2 V is applied to the drain end of the NAND string at the channel region 1022. Vbl is typically set at a power supply voltage Vdd for the sense circuits and is therefore limited to this level. The memory cells 1009-1012 will be in a conductive state and allow the bit line voltage to pass if the word line voltage (VWL) minus the Vth exceeds Vbl. For example, with a word line voltage VWL=2 V and Vth=−1 V, 2−(−1)=3 V and this exceeds Vbl=2 V. With a word line voltage VWL=1 V and Vth=−1 V, 1−(−1)=2 V and this equals Vbl=2 V. This borderline case may allow some pre-charging from the bit line. The WLn−1 memory cell 1008 is cutoff so that the pre-charge voltage cannot pass to the source side channel region 1021. The associated channel region 1021 will therefore have a floating voltage based on VWLn−Vth.

FIG. 10B depicts channel voltages consistent with FIG. 10A. The channel region 1021 has a voltage of 0-5=−5 V (plot 1040) while the channel region 1022 has a voltage of 2 V (plot 1043). This results in a channel gradient (plot 1041) of 7 V and the generation of electrons 1046 and holes 1045. The electrons are accelerated by a lateral field (along the length of the channel) and a vertical electric field (vertical to the length of the channel, and through the MANOS (metal-Al2O3-Si3N4-SiO2-Si) layers of the memory hole), so that they become hot carriers which can be injected into the charge trapping layer of the WLn memory cell 1009, resulting in a disturb. The vertical electric field is greater when VWLn is greater, so that reducing VWLn from 2 V to 1 V, for example, can reduce the vertical electric field and the amount of electron injection.

Note that VWLn can be the same as the voltage VWL_ds on the drain side word line, in one approach. During the pre-charge phase, Vpch_ds is used to represent the voltage of the drain side word lines, Vpch_n is used to represent the voltage of WLn, and Vpch_ds_n is used to represent a voltage which is applied to both WLn and the drain side word lines.

FIG. 11A depicts a NAND string and corresponding channel regions in another example pre-charge configuration. The source side word line voltage is elevated to a level referred to as Vpch_ss_el, e.g., 2 V, for a subset of the source side word lines, where the subset 1131 includes multiple adjacent word lines. For example, the subset 1131 includes three word line, WLn−3 to WLn−1. A remainder of the source side word lines, e.g., in a subset 1130, received a lower voltage, e.g., 0 V. Due to the elevated voltage of the subset 1131, which is adjacent to WLn, the voltage of the associated channel region 1102 is increased from −5 V as in FIG. 10B to −3 V (plot 1141 in FIG. 11B). The channel gradient (plot 1142) adjacent to WLn is therefore reduced from 7 V to 5 V. As a result, the number of electron-hole pairs, including holes 1144 and electrons 1145, is reduced so that the injection type of program disturb of WLn is reduced.

The number of word lines in the subset 1131 can be chosen to provide a very small probability that the associated memory cells are all in the erased state. With a random assignment of data states, and eight possible states, for example, the probability of three memory cells in a row in a NAND string being in the erased state is (⅛)^3=0.0019 or 0.19%. In another example, with sixteen possible states, the probability of two memory cells in a row being in the erased state is (1/16)^2=0.0039 or 0.39%. Generally, the number of word lines in the subset 1131 can be chosen so that a probability of memory cells connected to the multiple adjacent word lines in one of the NAND strings are all in the erased state is below 0.5% or other threshold. If the memory cells in the subset 1131 are all in the erased state, the associated channel region will not be cutoff and a channel gradient (plot 1146) will be formed between the subsets 1130 and 1131. In this case, the channel voltage of WLn−3 to WLn−1 will be represented by plot 1147. Essentially, the channel gradient of plot 1041 in FIG. 10B will be moved toward the source end of the NAND stings, resulting in program disturb of the memory cells of WLn−3 in this example.

FIG. 11B depicts channel voltages consistent with FIG. 11A. The channel region 1101 associated with the subset 1130 has a voltage of −5 V (plot 1140), the channel region 1102 associated with the subset 1131 has a voltage of −3 V (plot 1141), and the channel region 1022 associated with the set of word lines 1031 has a voltage of 2 V (plot 1143), as in FIG. 10B.

In one approach, Vpch_ss_el is adjusted based on a risk factor for the program disturb. For example, a plurality of word lines may comprise an adjacent subset (e.g., 1131) of source-side word lines of the selected word line, where in a pre-charge phase, a control circuit is configured to apply a voltage (Vpch_ss_el) to the adjacent subset of source-side word lines which is greater when a risk factor indicates a risk of the injection type of program disturb is greater. A higher value of Vpch_ss_el results in a smaller channel gradient.

Vpch_ss_el=2 V is an example of a first voltage which is applied to a first subset 1131 of adjacent word lines of the source-side word lines. Vpch_ss=0 V is an example of a second voltage, lower than the first voltage, which is applied to a second subset 1130 of adjacent word lines of the source-side word lines, wherein the first subset of adjacent word lines is adjacent to the second subset of adjacent word lines.

In one approach, as depicted in FIG. 15E, the first voltage is relatively higher when a number of word lines in the first subset of adjacent word lines is relatively larger.

FIG. 12A depicts a NAND string and corresponding channel regions in another example pre-charge configuration. Instead of reducing the channel gradient adjacent to WLn as in FIGS. 11A and 11B, this example reduces the length of the channel region in which the holes reside. In particular, the elevated source side pre-charge voltage, Vpch_ss_el, is applied to a subset of word lines 1231 which is not adjacent to WLn. The lower pre-charge is applied to the subset of word lines 1232 which is adjacent to WLn, and to another subset of word lines 1230 which is adjacent to the subset 1231. The subset 1231 is adjacent to, and between, the subsets 1230 and 1232. Each subset comprises multiple adjacent word lines.

The channel regions 1201, 1202 and 1203 are associated with subsets 1230, 1231 and 1232, respectively, and have voltages of −5 V, −3 V and −5 V, respectively, as denoted by plots 1240, 1241 and 1242, respectively. As a result, the holes which are generated by the channel gradient (plot 1243) will remain in the relatively small area of the channel region 1203 rather than moving throughout the source side of the channel. The holes will tend to increase the voltage of the channel region 1203 relatively quickly, since the capacitance of the channel region 1203 is relatively small. The time period in which the channel gradient exists will therefore also be reduced, along with the risk of program disturb.

The number of word lines in the subset 1231 can be greater than the number of word lines in the subset 1232, in one approach, to maintain a sufficiently strong barrier to the holes to contain them in the channel region 1203. In one approach, the number of word lines in the subset 1231 is at least twice as large as the number of word lines in the subset 1232. It is also possible for Vpch_ss_el to be applied to the word lines in the subset 1230, so that Vpch_ss_el is applied to all of the word lines on the source side of the subset 1231.

FIG. 12B depicts channel voltages consistent with FIG. 12A. The channel regions 1201, 1202 and 1203 are associated with subsets 1230, 1231 and 1232, respectively, and have voltages of −5 V, −3 V and −5 V, respectively, as denoted by plots 1240, 1241 and 1242, respectively. The channel region 1022 is associated with WLn and the drain side word lines 1031 as in FIG. 10B.

Figure 13A:
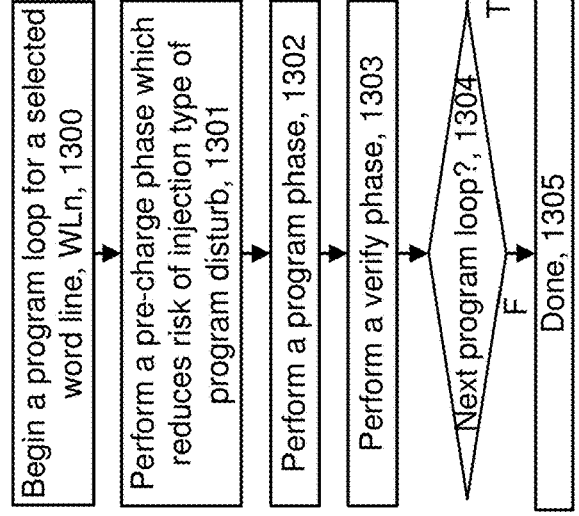
FIG. 13A depicts a flowchart of an example process for performing a program loop in a program operation.

FIG. 13A depicts a flowchart of an example process for performing a program loop in a program operation. A program operation can include a series of program loops such as discussed in connection with FIG. 9A. Step 1300 begins a program loop for a selected word line, WLn. Step 1301 performs a pre-charge phase of the program loop which reduces the risk of an injection type of program disturb. Step 1302 performs a program phase of the program loop. Step 1303 performs a verify phase of the program loop. See also FIG. 14, which depicts the pre-charge, program and verify phases 1407-1409, respectively.

A decision step 1304 determines if there is a next program loop. A next program loop is performed is the program operation is not yet completed. If the decision step 1304 is true, step 1300 is repeated by starting the next program loop. If the decision step 1304 is false, step 1305 indicates the program operation is done.

FIG. 13B depicts a flowchart of an example process for performing the pre-charge phase of step 1301 of FIG. 13A. Step 1310 includes determining risk factors for the injection type of program disturb, such as temperature, WLn position, Vpgm and sub-block position. This can be done by the control circuitry 110 or the controller 122 of FIG. 1, for example. Step 1311 includes adjusting Vpch_n, Vpch_ds and/or Vpch_ss in the pre-charge phase to reduce the risk of the injection type of program disturb, based on the risk factors.

FIG. 13C depicts a flowchart of another example process for performing the pre-charge phase of step 1301 of FIG. 13A. Step 1320 includes applying a turn-on voltage of Vsgd=Vsgs=6 V to the SGD and SGS transistors, to provide them in a strongly conductive state. Step 1321 includes applying a bit line pre-charge of Vbl_unsel=2 V. Step 1322 includes applying Vbl_sel=0 V to the bit lines of the selected NAND strings. Step 1323 includes applying a pre-charge voltage of Vpch_ds=1-2 V to the drain-side word lines of WLn. This provides the associated channel regions in a conductive state to pass the bit line voltage into the channel. Step 1324 includes applying a pre-charge voltage of Vpch_n=1-2 V to the selected word line. This also provides the associated channel region in a conductive state to pass the bit line voltage into the channel, when a WLn memory cell is in the erased state or a low state, at the beginning of a program operation, or throughout the program operation.

Step 1325 includes applying a pre-charge voltage Vpch_ss=0-2 V to the source-side word lines of WLn. The associated channel regions are in a non-conductive state since the memory cells have been programmed to higher Vth levels. The bit line pre-charge mainly pre-charges the portion of the channel on the drain side of WLn. Step 1326 includes applying Vsl=1 V to the source line. This provides a back bias for the SGS transistors to reduce leakage.

The steps may be performed concurrently. The voltages depicted in the various figures are examples.

Figure 13D:
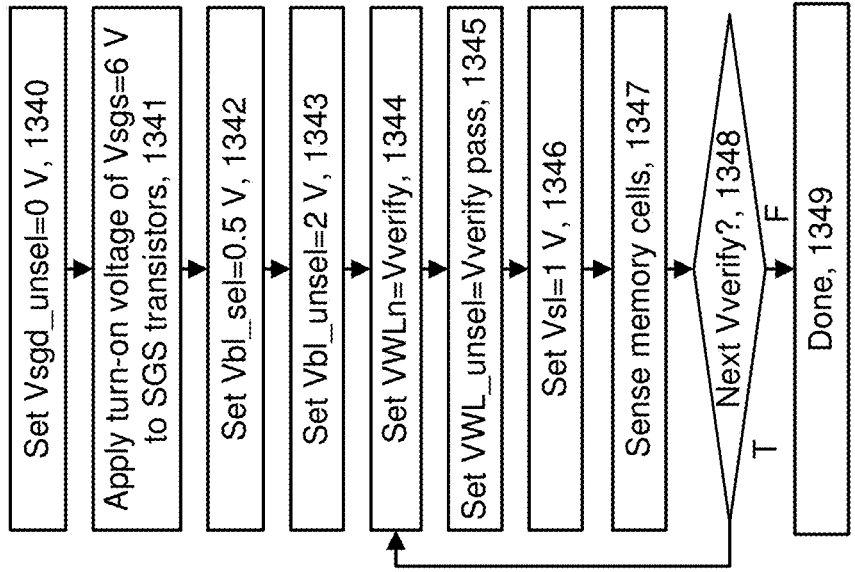
FIG. 13D depicts a flowchart of an example process for performing the program phase of step 1302 of FIG. 13A.

FIG. 13D depicts a flowchart of an example process for performing the program phase of step 1302 of FIG. 13A. Step 1330 includes applying Vsgd_sel=2.5 V to the selected SGD transistors, e.g., the SGD transistors in a selected sub-block. Step 1331 includes applying Vsgd_unsel=Vsgs=0 V. Vsgd_unsel is for the SGD transistors in the unselected sub-blocks. This provides the unselected SGD transistors in a non-conductive state. Step 1332 includes applying Vbl_unsel=2 V to the inhibited bit lines. This provides the associated SGD transistors in a non-conductive state to allow channel boosting to occur. Step 1333 include applying Vbl_sel=0 V to the programmed bit lines. This provides the associated SGD transistors in a conductive state to allow programming to occur. Step 1334 includes applying a program pass voltage of Vprogram pass=8-10 V to the unselected word lines. This boosts the associated channel regions in the inhibited or unselected NAND strings. Step 1335 includes applying a program voltage of VWLn=Vpgm (e.g., 20-30 V) to the selected word line. This provides a high gate-to-channel voltage which programs the WLn memory cells in the selected NAND strings. Step 1336 includes applying Vsl to the source line. This continues to provide a back bias for the SGS transistors to reduce leakage.

The steps may be performed concurrently.

Figure 13E:
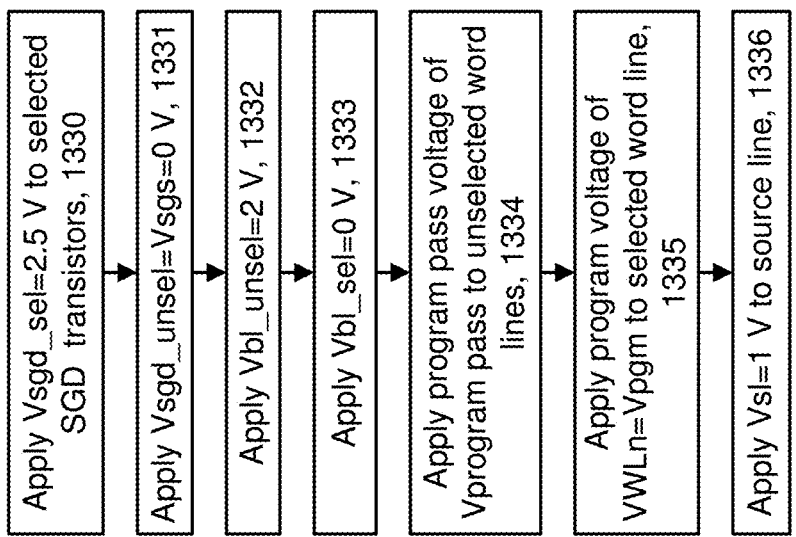
FIG. 13E depicts a flowchart of an example process for performing the verify phase of step 1303 of FIG. 13A.

FIG. 13E depicts a flowchart of an example process for performing the verify phase of step 1303 of FIG. 13A. Step 1340 sets Vsgd_unsel=0 V. Step 1341 includes applying a turn-on voltage of Vsgs=6 V to the SGS transistors. Step 1342 includes setting Vbl_sel=0.5 V. Step 1343 includes setting Vbl_unsel=2 V. Step 1344 includes setting VWL=Vverify, a verify voltage. Step 1345 includes setting VWLunsel=Vverify pass, a verify pass voltage, such as 8-10 V. Step 1346 includes setting Vsl=1 V. Step 1347 includes sensing the memory cells.

A decision step 1348 determines if there is a next Vverify to apply to WLn. If the decision step 1348 is true, step 1344 is repeated by applying the next Vverify to WLn. If the decision step 13484 is false, step 1349 indicates the process is done.

The steps may be performed concurrently.

FIG. 14 depicts example voltage signals for performing the process of FIG. 13A. The vertical dimension denotes voltage and the horizontal dimension denotes time, with time points t0-t12. The period of time depicted corresponds to one program loop and includes a pre-charge phase 1407 (t0-t2), a program phase 1408 (t2-t8) and a verify phase 1409 (t9-t12). Voltage signals 1400, 1410, 1420, 1430, 1440 and 1450 depict VWLn, VWL_ds, VWL_ss, Vsg, Vbl and Vsl, respectively.

In the pre-charge phase, VWLn can be set to a pre-charge voltage Vpch_n in the range of 1-2 V, for example, depending on the risk factors for program disturb. VWL_ds can also be set to a pre-charge voltage Vpch_ds in the range of 1-2 V, for example, depending on the risk factors for program disturb. VWL_ss can be set to a pre-charge voltage Vpch_ss in the range of 0-2 V, for example, depending on the program disturb countermeasure being used. In the example of FIGS. 10A and 10B, a common Vpch_ss is applied to all of the source side word lines. In the example of FIG. 11A-12B, two levels of Vpch_ss are applied to different subsets of the source side word lines.

A positive Vbl (e.g., 2 V) is provided to the drain-side channels of the inhibited NAND strings to remove residue electrons and to provide a small amount of boosting such as 1-2 V. The SGD transistors of the selected and unselected sub-blocks are in a conductive state at this time, with a voltage of Vsg=6 V, for example. This allows the bit line voltage to be passed to the drain end channel. It is also possible for the SGS transistors of the selected and unselected sub-blocks to be in a conductive state at this time, with a voltage of 6 V, for example to allow Vsl to be passed to the source end of the channel.

Vsg is set to 6 V to pass the bit line voltage to the drain ends of the NAND strings.

In the program phase, VWLn and Vwl_unsel are ramped up, e.g., starting at t3, to provide a capacitive coupling up of the channels of the inhibited NAND strings. VWLn is then ramped up further at t5 to the peak program pulse level of Vpgm and held at Vpgm until t4. After the application of the program pulse, the word line voltages are ramped down in a recovery process. During the program pulse, Vsgd_sel is high enough to provide the selected SGD transistors in a conductive state for the selected NAND strings, which receive Vbl_sel=0 V, but low enough to provide the selected SGD transistors in a non-conductive state for the inhibited NAND strings, which receive Vbl_unsel=2 V.

Subsequently, in the verify phase, one or more verify tests are performed by applying one or more verify voltages on WLn and, for each verify voltage, sensing the conductive state of the memory cells in the selected NAND strings of the selected sub-block. The SGD and SGS transistors are in a strongly conductive state to allow sensing to occur for the selected memory cells.

FIG. 15A depicts an example plot of Vpch_ds_n versus temperature (Temp.). A lower temperature is associated with a higher risk of the injection type of program disturb. Accordingly, one possible countermeasure is to set a relatively low Vpch_ds_n when the temperature is relatively low, e.g., below a threshold of Temp_th such as 25 C. At low temperatures, electrons encounter fewer scattering events when flowing in the channel. The electrons may therefore keep a higher velocity and have a higher probability of being injected into the charge trapping layer of a memory cell.

In one approach, Vpch_ds_n is set to a minimum voltage V1, e.g., 1 V, when the temperature is below Temp_th. When the temperature is at or above Temp_th, Vpch_ds_n can be set to a higher voltage V2, e.g., 1.5 V or Vpch_ds_n can be increased as the temperature increases, reaching a maximum voltage V3, e.g., 2 V. Vpch_ds_n can be an increasing function of the temperature. That is, the voltage applied to the selected word line and the voltage applied to the drain-side word lines can be an increasing function of the temperature. See also FIG. 17A-17H regarding the effect of temperature on program disturb.

FIG. 15B depicts an example plot of Vpch_ds_n versus a selected sub-block, SBsel. As mentioned, the memory cells of a word line WLn can be programmed one sub-block at a time. In this programming technique, the memory cells in the first-programmed sub-block (SB0) are subject to the highest risk of program disturb because, while in a programmed state, they are inhibited from programming during the programming of three other sub-blocks. Similarly, the memory cells in the second and third programmed sub-blocks (SB1 and SB2, respectively) are subject to the second and third highest risk, respectively, of program disturb. The last programmed sub-block, SB3, is subject to the lowest risk of program disturb because it is not inhibited after being programmed. As a result, a countermeasure for preventing program disturb can be adjusted on a per sub-block basis, where the technique provides a stronger countermeasure (e.g., lower Vpch_ds_n) during programming of a later-programmed sub-block in a sub-block programming order. A risk factor for program disturb comprises a number of sub-blocks in a plurality of sub-blocks of a block which were programmed before a selected sub-block. The risk is greater when this number is greater.

One approach is to reduce Vpch_ds_n when a later-programmed sub-block is the selected sub-block. For example, when programming SB3, the number of earlier-programmed sub-blocks is a maximum at three blocks, so that Vpch_ds_n can be set to a minimum voltage of V1. When programming SB2, the number of earlier-programmed sub-blocks is lower at two, and Vpch_ds_n can be set to a next higher voltage of V2. When programming SB1, the number of earlier-programmed sub-blocks is lower still at one, and Vpch_ds_n can be set to a next higher voltage of V3. When programming SB0, the number of earlier-programmed sub-blocks is lowest at zero, and Vpch_ds_n can be set to the highest voltage of V4. V4>V3>V2>V1.

For example, assume that a program operation uses 20 program loops. When the WLn memory cells in SB0 are programmed, the WLn memory cells in SB1-SB3 are subject to the pre-charge conditions 20 times. However, since they are in the erased state, the conditions for the injection type of disturb are not present, since there is no channel gradient. When the WLn memory cells in SB1 are programmed, the WLn memory cells in SB0 are programmed so that the conditions for the injection type of disturb are present in SB0. The WLn memory cells in SB0 are subject to the pre-charge conditions 20 times. When the WLn memory cells in SB2 are programmed, the WLn memory cells in SB0 are subject to the pre-charge conditions a total of 40 times and the WLn memory cells in SB1 are subject to the pre-charge conditions 20 times. When the WLn memory cells in SB3 are programmed, the WLn memory cells in SB0 are subject to the pre-charge conditions a total of 60 times, the WLn memory cells in SB1 are subject to the pre-charge conditions a total of 40 times, and the WLn memory cells in SB2 are subject to the pre-charge conditions 20 times. By reducing Vpch_ds_n as the later sub-blocks are programmed, the effects of the additional exposure to the pre-charge conditions in the earlier programmed sub-blocks can be reduced.

For example, the WLn memory cells of SB0 will be subject to the pre-charge 20 times with Vpch_ds_n=V3, 20 times with Vpch_ds_n=V2 and 20 times with Vpch_ds_n=V1. The disturb is less than if the WLn memory cells of SB0 were subject to the pre-charge 60 times with Vpch_ds_n=V3.

In one approach, the voltage of the selected word line and the voltage of the drain-side word lines are relatively lower when the number of sub-blocks in the plurality of sub-blocks which are programmed before the selected sub-block is relatively higher.

See also FIG. 18A-18D regarding the effect on program disturb of the position of the selected sub-block in a sub-block programming order of a block.

FIG. 15C depicts an example plot of Vpch_ds and Vpch_n versus the position of WLn. When WLn is relatively close the drain ends of the NAND strings in a block, the source side region of the channel is relatively large and has a relatively large capacitance. As a result, it will take a relatively long time for the holes which are generated by the channel gradient to increase the associated channel voltage and thus reduce the channel gradient. The channel gradient will therefore generate electron-hole pairs for a relatively long time, resulting in a higher risk of program disturb. The distance of WLn from the source side of the NAND strings is therefore a risk factor for program disturb.

As a result, a countermeasure for preventing program disturb can be adjusted based on the position of WLn in a block or stack, where the technique provides a stronger countermeasure when the distance of WLn from the source side of the NAND strings is greater.

One approach is to maintain Vpch_ds at a constant level regardless of the WLn position, as represented by the solid line (plot 1510), while reducing Vpch_n as the WLn position is closer to the drain side. By reducing Vpch_n, the electric field across the layers of the WLn memory cells is reduced, so the electrons are less likely to be injected into the charge trapping layer. In this case, Vpch_n is a decreasing function of the distance of WLn from the source side of the NAND strings. That is, Vpch_n is relatively lower when the distance is relatively greater. By keeping Vpch_ds at a constant voltage, the boosting of the drain side channel is not impaired so that the insufficient boosting type of program disturb is avoided.

In another option, Vpch_ds also decreases as the distance increases (plot 1511), but by a lesser amount than the decrease of Vpch_n. By reducing Vpch_ds by a lesser amount than Vpch_n, there is a smaller reduction on the boosting of the drain side channel so that there is a smaller risk of the insufficient boosting type of program disturb is avoided.

In this example, the word lines range from WL0-WL95, and Vpch_ds=Vpch_n for WL0-WL15 before Vpch_n begins to decrease.

FIG. 15D depicts an example plot of Vpch_ds_n versus the position of WLn. Further to the discussion of FIG. 15C, Vpch_ds_n (the voltage of the drain side word lines and WLn) can decrease as the distance of WLn from the source side of the NAND strings increases. In this example, the word lines range from WL0-WL95, Vpch_ds_n is constant at a maximum voltage from WL0-WL15, decreases from WL16-WL80 and is constant at a minimum voltage from WL81-WL95.

FIG. 15E depicts an example plot of a number of word lines receiving Vpch_ss_el versus Vpch_ss_el, consistent with FIGS. 12A and 12B. As mentioned, the number of word lines receiving the elevated voltage should be high enough so that the probability of having successive erased memory cells in a NAND string is below a threshold. Also, when the number of word lines receiving the elevated voltage is relatively large, Vpch_ss_el can be relatively high. This provides a stronger program disturb countermeasure since the channel gradient is lower when Vpch_ss_el is higher. In this example, the minimum number of word lines is three, in which case Vpch_ss_el=V1. As the number of word lines increases, Vpch_ss_el increases until it reaches V3.

FIG. 15F depicts an example plot of Vpch_ds_n versus Vpgm. As mentioned, the magnitude of Vpgm is a risk factor for program disturb which occurs during the program phase of a program loop. When Vpgm is greater, there is a greater gate-to-channel voltage which can cause a gate-to-channel type of program disturb in the program phase rather than an injection type of program disturb in the pre-charge phase. However, a stronger countermeasure can be applied for the injection type of program disturb during the pre-charge phase when the risk of program disturb in the program phase is relatively high, to reduce the overall program disturb.

In this example, Vpgm ranges from a minimum of Vpgm_min to a maximum of Vpgm_max as Vpch_ds_n decreases from a maximum of V3 to a minimum of V1. In another option, Vpch_ds_n is constant at V3 until a threshold Vpgm is reached after which Vpch_ds_n is stepped down or ramped down as Vpgm increases. As mentioned, the program loop number can be used as a proxy for Vpgm when incremental step pulse programming is used.

In this example, the voltage applied to the selected word line and the voltage applied to the drain-side word lines decrease as the magnitude of the program voltage increases.

FIG. 16 depicts a plot of an upper tail of a Vth of memory cells of WLn versus Vpch_ds_n for different data states S0-S4 of FIG. 8B. The Vth of the upper tail is a metric of program disturb. For S0, the Vth increases at lower and higher values of Vpch_ds_n. At lower values of Vpch_ds_n, the drain side channel boosting is lower so that program disturb can occur in the program phase due to insufficient channel boosting. At higher values of Vpch_ds_n, the drain side channel boosting is higher but the risk of the injection type of program disturb as described herein is higher. For the higher states such as S1-S3, the Vth is flat at lower to moderate levels of Vpch_ds_n and there is a small increase in Vth as Vpch_ds_n increases to a maximum level. For state S4 and above (e.g., S5-S15 in the sixteen state example), the Vth is flat regardless of Vpch_ds_n. This demonstrates that the injection type of program disturb mainly affects the erased state and, to a lesser degree, other low states.

By selecting Vpch_ds_n=Vx at a trough of the plot for S0, the program disturb can be minimized.

This example is for WLn=WL80, where WL0-WL79 are programmed to the S13 state in a sixteen state implementation.

FIG. 17A depicts a plot of an upper tail of a Vth of S0-state memory cells of WLn versus Vpch_ds_n for different data states on WLn−1, at a high temperature. The plots of FIG. 17A-17H demonstrate that, as mentioned, the injection type of program disturb is greater at lower temperatures and for lower data states. Additionally, the injection type of program disturb for the WLn memory cells is greater when the adjacent WLn−1 memory cell is in a higher state. These examples are for a block with 96 word lines, where WLn=WL80, WL0-WL78 are programmed to the S13 state in a sixteen state implementation, and each WLn−1 memory cell is varied between S0 and S15. Recall from FIG. 10B that the source side channel voltage is lower when the Vth of the memory cells is higher. When the source side channel voltage is lower, the channel gradient and risk of program disturb is greater. Thus, when the data state of the WLn−1 memory cell is higher, the program disturb is greater, as demonstrated by FIG. 17A-17H.

For the lower states, the disturb is generally flat at lower values of Vpch_ds_n and then increases at higher values of Vpch_ds_n. For the higher states, the disturb tends to have a minimum at midrange values of Vpch_ds_n.

FIG. 17B depicts a plot of an upper tail of a Vth of S0-state memory cells of WLn versus Vpch_ds_n for different data states on WLn−1, at a low temperature. Comparing these plots to those in FIG. 17A, the amount of disturb is higher at higher values of Vpch_ds_n. The disturb is generally flat at lower values of Vpch_ds_n and then increases at higher values of Vpch_ds_n.

FIG. 17C depicts a plot of an upper tail of a Vth of S1-state memory cells of WLn versus Vpch_ds_n for different data states on WLn−1, at a high temperature. The disturb is generally flat at lower values of Vpch_ds_n and then increases at higher values of Vpch_ds_n.

FIG. 17D depicts a plot of an upper tail of a Vth of S1-state memory cells of WLn versus Vpch_ds_n for different data states on WLn−1, at a low temperature. Comparing these plots to those in FIG. 17C, the amount of disturb is significantly higher for the higher data states.

FIG. 17E depicts a plot of an upper tail of a Vth of S2-state memory cells of WLn versus Vpch_ds_n for different data states on WLn−1, at a high temperature. Compared to S0 and S1, there is a smaller increase in disturb for the higher states versus the lower states.

FIG. 17F depicts a plot of an upper tail of a Vth of S2-state memory cells of WLn versus Vpch_ds_n for different data states on WLn–1, at a low temperature. Compared to FIG. 17E, there is a larger increase in disturb for the higher states versus the lower states.

FIG. 17G depicts a plot of an upper tail of a Vth of S3-state memory cells of WLn versus Vpch_ds_n for different data states on WLn–1, at a high temperature. Compared to S0, S1 and S2, there is a smaller increase in disturb for the higher states versus the lower states.

FIG. 17H depicts a plot of an upper tail of a Vth of S3-state memory cells of WLn versus Vpch_ds_n for different data states on WLn–1, at a low temperature. Compared to FIG. 17G, there is a larger increase in disturb for the higher states versus the lower states.

FIG. 18A depicts a plot of an upper tail of a Vth of S0-state memory cells of WLn versus Vpch_ds_n for different sub-blocks SB0-SB3. As mentioned, a risk factor for program disturb is the position of a selected sub-block in a sub-block programming order, and the corresponding number of sub-blocks which are programmed before the selected sub-block. The risk is greater when this number is greater. The amount of program disturb on a WLn memory cell can also be a function of the data state of the memory cell and of Vpch_ds_n. Generally, the program disturb is lower when Vpch_ds_n is lower. However, if Vpch_ds_n is too low, the drain side channel cannot be properly boosted in the re-charge phase leading to an insufficient boosting type of program disturb in the program phase. The ECC capability of the memory device can be a factor in setting Vpch_ds_n.

For the erased state S0, the amount of disturb is about the same for each sub-block. Since the WLn memory cells are not programmed, the sub-block programming order is not a significant factor.

FIG. 18B depicts a plot of an upper tail of a Vth of S1-state memory cells of WLn versus Vpch_ds_n for different sub-blocks SB0-SB3. The Vth increase is clearly greater for the earlier-programmed sub-blocks, e.g., SB0, than for the later-programmed sub-blocks, e.g., SB3. At the maximum level of Vpch_ds_n=3 V, the Vth of the SB0 WLn memory cells is about 0.20 V higher than the Vth of the SB3 WLn memory cells.

FIG. 18C depicts a plot of an upper tail of a Vth of S2-state memory cells of WLn versus Vpch_ds_n for different sub-blocks SB0-SB3. As before, the Vth increase is clearly greater for the earlier-programmed sub-blocks than for the later-programmed sub-blocks. At the maximum level of Vpch_ds_n=3 V, the Vth of the SB0 WLn memory cells is about 0.17 V higher than the Vth of the SB3 WLn memory cells.

FIG. 18D depicts a plot of an upper tail of a Vth of S3-state memory cells of WLn versus Vpch_ds_n for different sub-blocks SB0-SB3. As before, the Vth increase is clearly greater for the earlier-programmed sub-blocks than for the later-programmed sub-blocks. At the maximum level of Vpch_ds_n=3 V, the Vth of the SB0 WLn memory cells is about 0.15 V higher than the Vth of the SB3 WLn memory cells.

These disturb due to the sub-block programming order is therefore greatest for the lowest data states.

Accordingly, it can be see that in one implementation, an apparatus comprises: a set of memory cells arranged in NAND strings in a block, each NAND string comprising a source end and a drain end; a respective bit line connected to the drain end of each NAND string; a plurality of word lines connected to the set of memory cells and comprising a selected word line and drain-side word lines of the selected word line; and a control circuit configured to, in a program loop of a program operation: determine a risk factor for an injection type of program disturb, and perform a pre-charge phase in which a positive voltage is applied to the bit lines while a voltage is applied to the selected word line and a voltage is applied to the drain-side word lines, where the voltage applied to the selected word line is adjusted based on the risk factor.

In another implementation, a method comprises: performing a pre-charge phase of a program loop of a program operation for a set of memory cells, wherein the set of memory cells are arranged in NAND strings in a block, each NAND string comprising a source end and a drain end, a respective bit line is connected to the drain end of each NAND string, and a plurality of word lines are connected to the set of memory cells and comprise a selected word line and source-side word lines of the selected word line, the performing the pre-charge phase comprises: applying a positive voltage to the bit lines; and during the applying of the positive voltage to the bit lines, applying a voltage to a subset of the source-side word lines which is greater than a voltage applied to remaining word lines of the source-side word lines.

In another implementation, an apparatus comprises: a set of memory cells arranged in NAND strings in a block, each NAND string comprising a source end and a drain end; a respective bit line connected to the drain end of each NAND string; a plurality of word lines connected to the set of memory cells and comprising a selected word line and drain-side word lines of the selected word line; and a control circuit configured to, in a program loop of a program operation: perform a pre-charge phase in which a positive voltage is applied to the bit lines while a first voltage is applied to a first subset of adjacent word lines of the source-side word lines and a second voltage, lower than the first voltage, is applied to a second subset of adjacent word lines of the source-side word lines, wherein the first subset of adjacent word lines is adjacent to the second subset of adjacent word lines.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
a control circuit configured to connect to a plurality of word lines and a plurality of bit lines, the plurality of word lines and the plurality of bit lines are connected to a set of memory cells, the set of memory cells are arranged in NAND strings, each NAND string comprising a channel, a source end and a drain end, the drain end of each NAND string is connected to a respective bit line of the plurality of bit lines, the plurality of word lines comprising a selected word line, drain-side word lines of the selected word line and source-side word lines of the selected word line, the control circuit is configured to:

determine a risk factor for program disturb for memory cells connected to the selected word line;

determine a respective adjusted positive voltage for the selected word line and a respective adjusted positive voltage for the drain-side word lines based on the risk factor; and in a program loop of a program operation:
pre-charge a region of the channel in each NAND string, the region is adjacent to the selected word line and the drain-side word lines, wherein to pre-charge the region of the channel in each NAND string, the control circuit is configured to apply a positive voltage to the plurality of bit lines while applying the respective adjusted positive voltage for the selected word line to the selected word line and while applying the respective adjusted positive voltage for the drain-side word lines to the drain-side word lines; and after the pre-charge, apply a program voltage to the selected word line.

2. The apparatus of claim 1, wherein:
the source-side word lines are programmed; and
the drain side word lines are unprogrammed.

3. The apparatus of claim 1, wherein:
during the pre-charge of the region of the channel in each NAND string, the control circuit is configured to apply a voltage to a first subset of the source-side word lines which is greater when the risk factor indicates a risk of the program disturb is greater.

4. The apparatus of claim 1, wherein:
during the pre-charge of the region of the channel in each NAND string, the control circuit is configured to apply a voltage to a first subset of the source-side word lines which is greater than a voltage applied to a second subset of the source side word lines; and
the first subset of the source side word lines is between the selected word line and the second subset of the source-side word lines.

5. The apparatus of claim 4, wherein:
the first subset of the source-side word lines is adjacent to the selected word line.

6. The apparatus of claim 1, wherein:
during the pre-charge of the region of the channel in each NAND string, the control circuit is configured to apply a voltage to a first subset of the source-side word lines which is greater than a voltage applied to a second subset of the source side word lines and a voltage applied to a third subset of the source side word lines; and
the first subset of the source side word lines is between the second subset of the source-side word lines and the third subset of the source-side word lines.

7. The apparatus of claim 1, wherein:
the control circuit is on a different die than the set of memory cells.

8. The apparatus of claim 1, wherein:
the respective adjusted positive voltage for the selected word line and the respective adjusted positive voltage for the drain-side word lines are no greater than the positive voltage applied to the plurality of bit lines.

9. The apparatus of claim 1, wherein:
during the pre-charge of the region of the channel in each NAND string, the control circuit is configured to float a voltage of a region of the channel in each NAND string which is adjacent to the source-side word lines.

10. The apparatus of claim 1, wherein:
the respective adjusted positive voltage for the selected word line and the respective adjusted positive voltage for the drain-side word lines allow the positive voltage applied to the plurality of bit lines to charge the region of the channel in each NAND string.

11. A method, comprising:
determining a risk factor for program disturb on a memory cell connected to a selected word line among a plurality of word lines, the memory cell connected to the selected word line is in a NAND string, the NAND string comprises a channel and extends from a source end of the NAND string to a drain end of the NAND string, the NAND string comprises source-side memory cells on a source-side of the memory cell connected to the selected word line and drain-side memory cells on a drain-side of the memory cell connected to the selected word line;

determining a respective positive voltage for the memory cell connected to the selected word line and a respective positive voltage for the drain-side memory cells based on the risk factor; and in a program loop of a program operation:
pre-charging a region of the channel, the region is adjacent to the memory cell connected to the selected word line and the drain-side memory cells, the pre-charging comprises applying a positive voltage to a bit line connected to the drain end of the NAND string while applying the respective positive voltage for the to the memory cell connected to the selected word line to the memory cell connected to the selected word line and while applying the respective a positive voltage for the drain-side memory cells to the drain-side memory cells; and after the pre-charge, applying a program voltage to the memory cell connected to the selected word line.

12. The method of claim 11, further comprising:
during the pre-charging, applying a voltage to a first subset of the source-side memory cells which is greater when the risk factor indicates a risk of the program disturb is greater.

13. The method of claim 11, further comprising:
during the pre-charging, applying a voltage to a first subset of the source-side memory cells which is greater than a voltage applied to a second subset of the source side memory cells and a voltage applied to a third subset of the source side memory cells, wherein the first subset of the source side memory cells is between the second subset of the source-side memory cells and the third subset of the source-side memory cells.

14. The method of claim 11, further comprising:
during the pre-charging, applying a voltage to a first subset of the source-side memory cells which is greater than a voltage applied to a second subset of the source side memory cells, wherein the first subset of the source side memory cells is adjacent to the memory cell connected to the selected word line.

15. The method of claim 14, wherein:
the voltage applied to the first subset of the source-side memory cells is a function of a number of word lines connected to the memory cells in the first subset of the source-side memory cells; and
the voltage applied to the first subset of the source-side memory cells is higher when the number of word lines is larger.

16. An apparatus, comprising:
a circuit configured to connect to a plurality of word lines, the plurality of word lines are connected to a set of memory cells, the set of memory cells are arranged in NAND strings, each NAND string comprising a channel, a source end and a drain end, the drain end of each NAND string is connected to a respective bit line of a plurality of bit lines, the plurality of word lines comprising a selected word line, drain-side word lines of the selected word line and source-side word lines of the selected word line, the circuit is configured to:

determine a respective adjusted positive voltage for the selected word line and a respective adjusted positive voltage for the drain-side word lines in a pre-charge phase of a program loop of a program operation;

based on the respective adjusted positive voltage for the selected word line and the respective adjusted positive voltage for the drain-side word lines, perform the pre-charge phase, wherein to perform the pre-charge phase, the circuit is configured to pre-charge a region of the channel in each NAND string, the region is adjacent to the selected word line and the drain-side word lines, wherein to pre-charge the region of the channel in each NAND string, the circuit is configured to apply a positive voltage to the plurality of bit lines while applying the respective adjusted positive voltage for the selected word line to the selected word line and while applying the respective adjusted positive voltage for the drain-side word lines to the drain-side word lines; and after the pre-charge, apply a program voltage to the selected word line in a program phase of the program loop.

17. The apparatus of claim 16, wherein:

the circuit is configured to determine the respective adjusted positive voltage for the selected word line and the respective adjusted positive voltage for the drain-side word lines based on a temperature; and the respective adjusted positive voltage for the selected word line and the respective adjusted positive voltage for the drain-side word lines are lower when the temperature is lower.

18. The apparatus of claim 16, wherein:

the set of memory cells are arranged in a plurality of sub-blocks of a block;

the program operation is for a selected sub-block of the plurality of sub-blocks;

the circuit is configured to determine the respective adjusted positive voltage for the selected word line and the respective adjusted positive voltage for the drain-side word lines based on a position of the selected sub-block in a sub-block programming order of the block; and the respective adjusted positive voltage for the selected word line and the respective adjusted positive voltage for the drain-side word lines are glower when a number of sub-blocks in the plurality of sub-blocks which are programmed before the selected sub-block is higher.

19. The apparatus of claim 16, wherein:

during the pre-charge of the program loop, the circuit is configured to set a negative floating voltage in another region of the channel in each NAND string, the another region is adjacent to the source-side word lines.

20. The apparatus of claim 16, wherein:

the circuit is configured to determine the respective adjusted positive voltage for the selected word line and the respective adjusted positive voltage for the drain-side word lines based on a position of the selected word line among the plurality of word lines.

\* \* \* \* \*